(12) United States Patent
Wright et al.

(10) Patent No.: US 9,104,104 B2
(45) Date of Patent: Aug. 11, 2015

(54) METHOD OF PATTERNING A DEVICE

(71) Applicant: Orthogonal, Inc., Rochester, NY (US)

(72) Inventors: Charles Warren Wright, Fairport, NY (US); Diane Carol Freeman, Pittsford, NY (US); Frank Xavier Byrne, Webster, NY (US); John Andrew DeFranco, Rochester, NY (US); Sandra Rubsam, Webster, NY (US); Terrence Robert O'Toole, Webster, NY (US); Douglas Robert Robello, Webster, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 14/260,705

(22) Filed: Apr. 24, 2014

(65) Prior Publication Data

US 2014/0342287 A1 Nov. 20, 2014

Related U.S. Application Data

(60) Provisional application No. 61/815,465, filed on Apr. 24, 2013.

(51) Int. Cl.
*G03F 7/26* (2006.01)
*G03F 7/038* (2006.01)
*G03F 7/40* (2006.01)
*G03F 7/20* (2006.01)
*G03F 7/42* (2006.01)

(52) U.S. Cl.
CPC *G03F 7/038* (2013.01); *G03F 7/20* (2013.01); *G03F 7/40* (2013.01); *G03F 7/422* (2013.01)

(58) Field of Classification Search
CPC .. C08L 83/00; C11D 11/0047; C11D 7/5018; C11D 7/24; C11D 7/263; C11D 7/28; G03F 7/426; G03F 7/40; G03F 7/42; G03F 7/0046; G03F 7/00; G03F 7/0048; G03F 7/038; H01L 21/0337; H01L 21/31133; H01L 51/0018; H01L 21/027; H01L 51/0002; H01L 51/0023; H01L 51/50
USPC ............... 430/322, 270.1, 331, 324, 323, 325
See application file for complete search history.

(56) References Cited

U.S. PATENT DOCUMENTS

| 5,637,442 | A | 6/1997 | Bhatt et al. |
| 5,994,597 | A | 11/1999 | Bhatt et al. |
| 8,377,626 | B2 | 2/2013 | Kim et al. |
| 2004/0209188 | A1 | 10/2004 | Szmanda et al. |

(Continued)

FOREIGN PATENT DOCUMENTS

| WO | WO 2009/031731 A1 | 3/2009 |
| WO | WO 2011/139774 A2 | 11/2011 |
| WO | WO 2012/148884 A2 | 11/2012 |

*Primary Examiner* — Caleen Sullivan
(74) *Attorney, Agent, or Firm* — Merchant & Gould P.C.

(57) ABSTRACT

A fluorinated photopolymer is formed on a device substrate and exposed to patterned radiation. The photopolymer has a total fluorine content in a weight range of 15 to 60% and comprises at least three distinct repeating units, including a first repeating unit having a fluorine-containing group, a second repeating unit having an acid- or alcohol-forming precursor group, and a third repeating unit different from the first and second repeating units. The pattern-exposed photopolymer layer is contacted with a developing solution comprising at least a first fluorinated solvent that dissolves the unexposed photopolymer thereby forming a developed structure having a first pattern of photopolymer covering the substrate and a complementary second pattern of uncovered substrate. The developing solution is selected to provide a maximum photopolymer contrast in a range of 1.9 to 5.0.

18 Claims, 6 Drawing Sheets

(56) References Cited

U.S. PATENT DOCUMENTS

2009/0029274 A1* 1/2009 Olson et al. .................. 430/53
2010/0126934 A1 5/2010 Nakazato et al.
2010/0151395 A1 6/2010 Ishiduka et al.
2011/0159252 A1 6/2011 Ober et al.

* cited by examiner

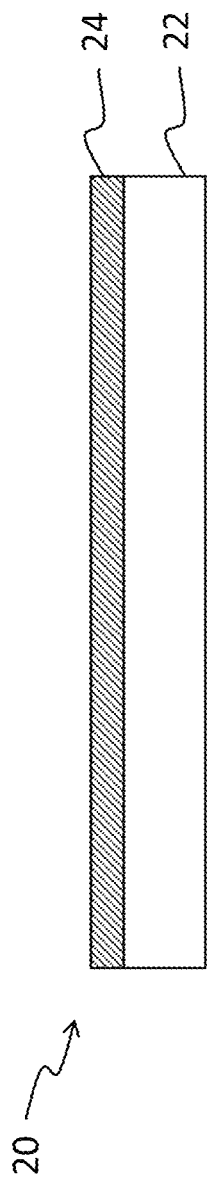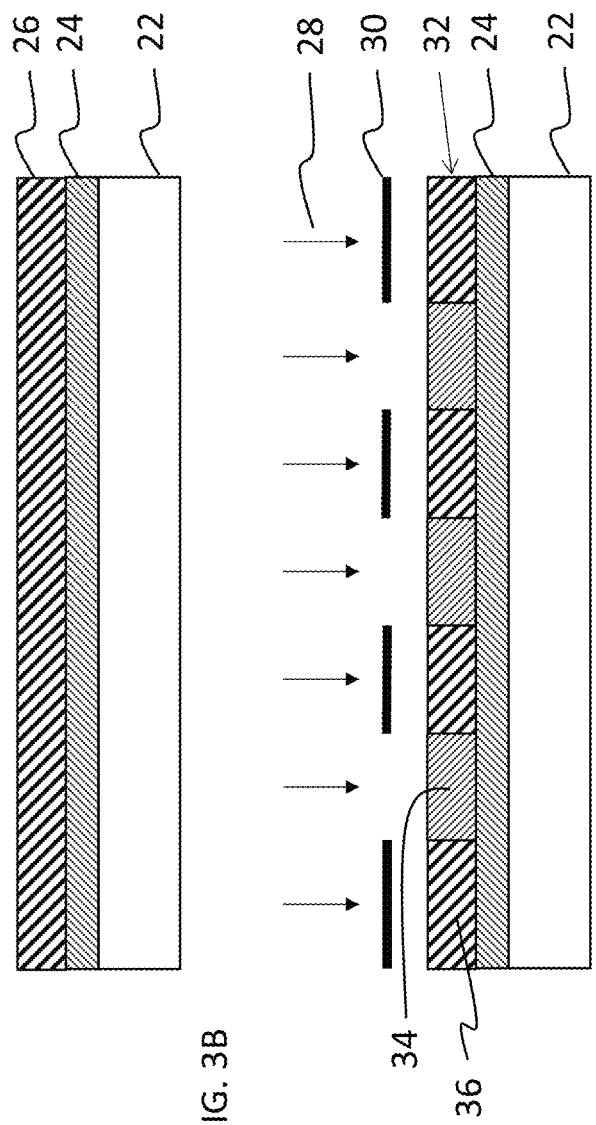

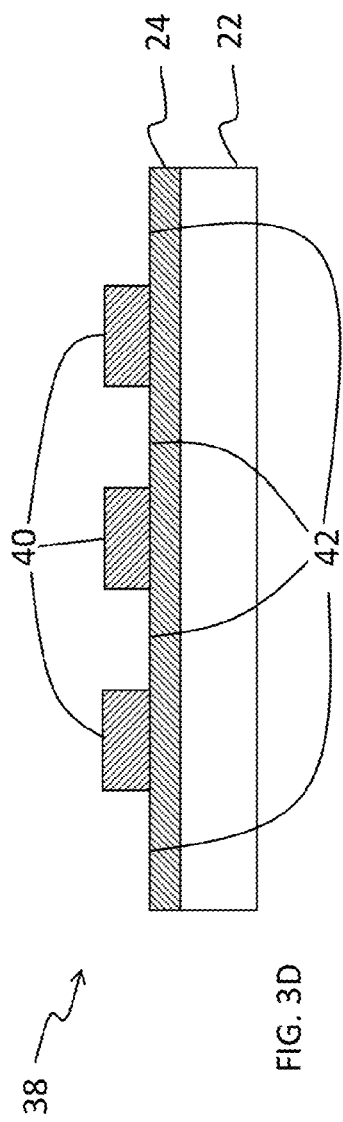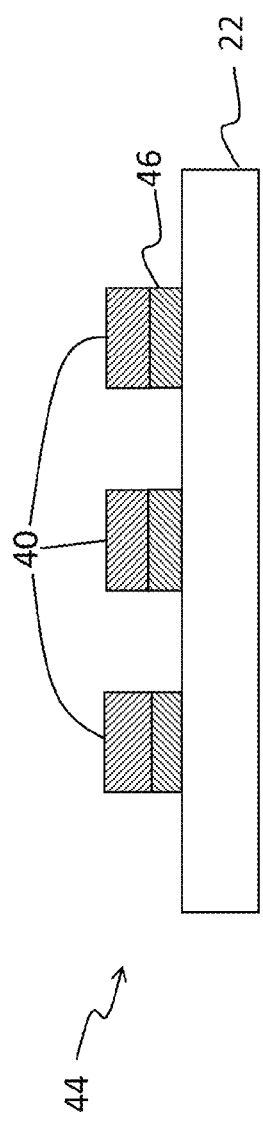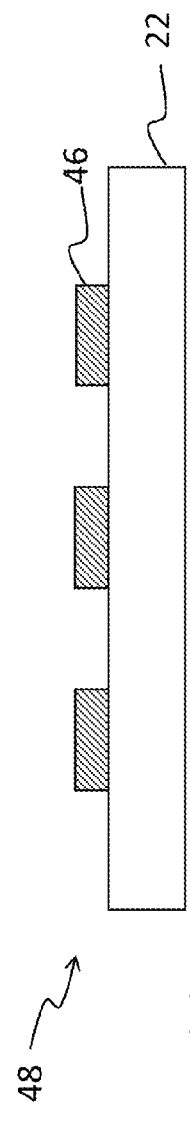

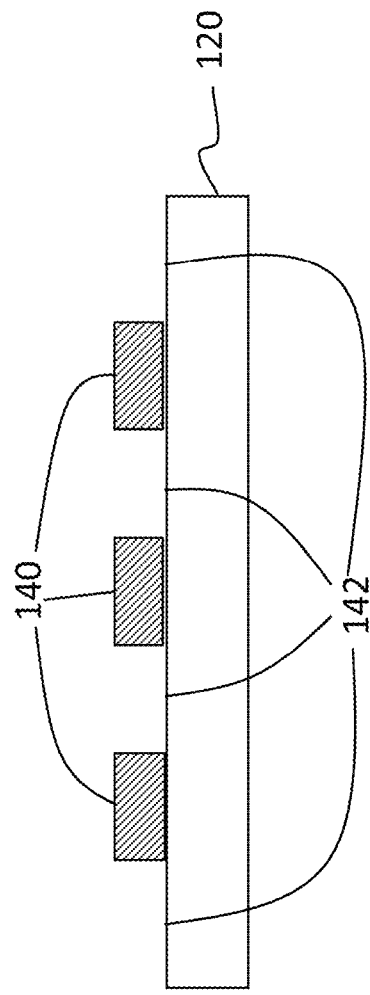

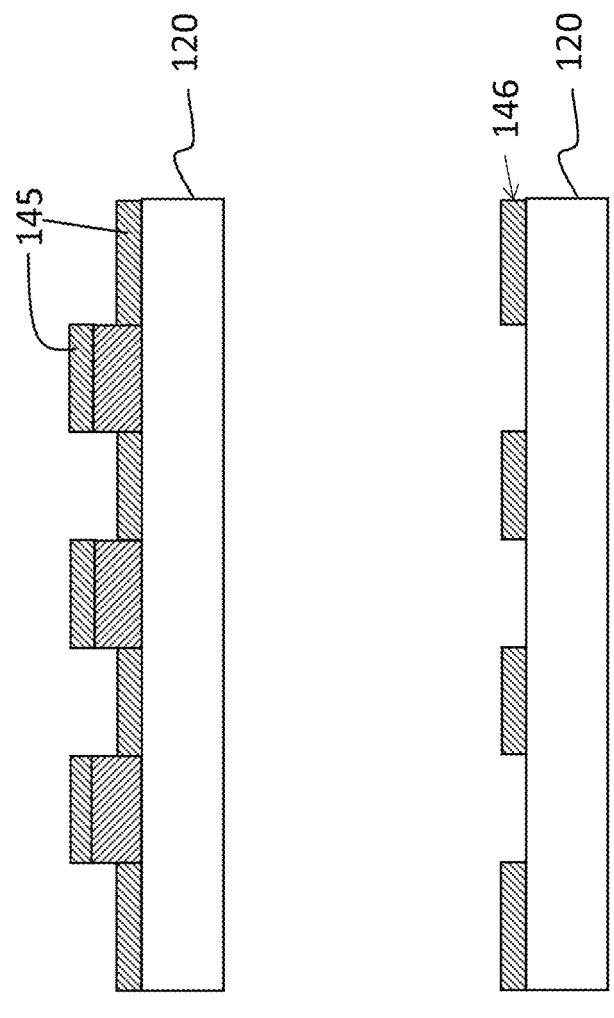

METHOD OF PATTERNING A DEVICE

CROSS-REFERENCE TO RELATED APPLICATIONS

This application claims the benefit of U.S. Provisional Application No. 61/815,465, filed on Apr. 24, 2013, the entire disclosure of which is hereby incorporated herein by reference. This application is also related to U.S. patent application entitled "Method of Patterning a Device,", filed on even date herewith.

STATEMENT REGARDING FEDERALLY-SPONSORED RESEARCH OR DEVELOPMENT

This invention was made with Government support under SBIR Phase II Grant No. 1058509 awarded by the National Science Foundation (NSF). The government may have certain rights in the invention.

BACKGROUND

1. Field of the Invention

The present invention relates to the use of fluorinated solvents and solvent blends for processing fluorinated photopolymers such as photoresists. Such solvents and photopolymers are particularly useful for patterning organic electronic and biological materials.

2. Discussion of Related Art

Organic electronic devices can offer significant performance and price advantages relative to conventional inorganic-based devices. As such, there has been much commercial interest in the use of organic materials in electronic device fabrication. For example, organic materials such as conductive polymers and organic semiconductors can be used to manufacture devices that have reduced weight and drastically greater mechanical flexibility compared to conventional electronic devices based on metals and silicon. Further, devices based on organic materials are likely to be significantly less damaging to the environment than devices made with inorganic materials, since organic materials do not require toxic metals and can ideally be fabricated using relatively benign solvents and methods of manufacture. Thus, in light of these superior weight and mechanical properties, and particularly in light of the lowered environmental impact in fabrication and additionally in disposal, electronic devices based on organic materials have the potential to be less expensive than devices based on conventional inorganic materials.

Fabrication of electronic devices, whether from organic or inorganic materials, requires the creation on an industrial scale of precisely defined patterns of the organic or inorganic active materials in these devices, often at a microscopic level. Most commonly, this is accomplished by "photolithography," in which a light-sensitive "photoresist" film that has been deposited on a substrate is exposed to patterned light. Although this can be done in numerous ways, typically a microscopic pattern of light and shadow created by shining a light through a photographic mask is used to expose the photoresist film, thereby changing the chemical properties of the portions of the photoresist that have been exposed to light. In a "positive" photoresist, the portions of the photoresist that are exposed to light become soluble in the "developer" solution that is then applied to the exposed photoresist, and the light-exposed portions of the photoresist are washed away ("developed") by the developer solvent to leave a pattern of unexposed photoresist and newly exposed underlying substrate. A "negative" photoresist is treated as for a positive photoresist; however, in a negative photoresist, it is the unexposed rather than the exposed portions of the photoresist that are washed away by the developing step.

In a standard process, the photoresist material is laying on top of an active material layer that is to be patterned. Once the development has taken place, the underlying layer is etched using either a liquid etchant or a reactive ion plasma (RIE) with the appropriate etch chemistry. In either case, the photoresist layer blocks the etching of active material directly beneath it. Once the etching is complete, the resist is typically stripped away, leaving the pattern of active material on the substrate.

Alternatively, the photoresist can be used with a so-called "liftoff" technique. In this case, the resist is processed on a substrate before the active material layer is deposited. After the photoresist pattern is formed, the active material is deposited on both the substrate and the photoresist. In an additional "lift-off" or "stripping" step, remaining photoresist along with an overlying layer of active material is removed via the appropriate solvent to leave the desired patterned active material.

Although the use of photoresists is routine in traditional electronic devices based on inorganic materials, photolithography has been difficult to achieve for devices using organic materials, thereby hindering the development of devices based on these materials. Specifically, organic materials are much less resistant to the solvents that are used for conventional photolithography, as well as to the intense light sources that are sometimes used in these processes, with the result that conventional lithographic solvents and processes tend to degrade organic electronics. Although there have been various attempts to overcome these problems, e.g., by ink-jet printing or shadow mask deposition, these alternative methods do not produce the same results as would be obtained with successful photolithography. Specifically, neither ink-jet printing nor shadow mask deposition can achieve the fine pattern resolutions that can be obtained by conventional lithography, with ink-jet printing limited to resolutions of approximately 10-20 µm and shadow mask deposition to resolutions of about 25-30 µm.

US 2011/0159252 discloses a useful method for patterning organic electronic materials by an "orthogonal" process that uses fluorinated solvents and fluorinated photoresists. The fluorinated solvents have very low interaction with organic electronic materials. WO 2012/148884 discloses additional fluorinated material sets for orthogonal processing.

Although these disclosures demonstrate good progress, the disclosed systems have yet to be commercially adopted. Further improvements in orthogonal, fluorinated photopolymer systems are needed with respect to performance, robustness and cost.

SUMMARY

In accordance with the present disclosure, a method of patterning a device comprises: providing a layer of a fluorinated photopolymer over a device substrate, the fluorinated photopolymer comprising at least three distinct repeating units, including a first repeating unit having a fluorine-containing group, a second repeating unit having an acid- or alcohol-forming precursor group, and a third repeating unit different from the first and second repeating units, wherein the photopolymer has a total fluorine content in a weight range of 15 to 60%;

exposing the photopolymer layer to patterned radiation to form an exposed photopolymer layer having a pattern of exposed photopolymer and a complementary pattern of unexposed photopolymer, wherein at least some of the acid- or alcohol-forming precursor groups in the exposed pattern react to form acid or alcohol group; and contacting the exposed photopolymer layer with a developing solution comprising at least a first fluorinated solvent that dissolves the unexposed photopolymer thereby forming a developed structure having a first pattern of photopolymer covering the substrate and a complementary second pattern of uncovered substrate, the developing solution selected to provide a maximum photopolymer contrast in a range of 1.9 to 5.0.

In another aspect of the present disclosure, a negative photopolymer system comprises: a photosensitive composition comprising a fluorinated photopolymer provided in a hydrofluoroether coating solvent, wherein the fluorinated photopolymer comprises at least two distinct repeating units, including a first repeating unit having a fluorine-containing group, a second repeating unit having an acid- or alcohol-forming precursor group, and a third repeating unit different from the first and second repeating units wherein the copolymer has a total fluorine content in a weight range of 15 to 60%; and a developing solution comprising at least a first hydrofluoroether solvent, the developing solution selected to provide a maximum photopolymer contrast in a range of 1.9 to 5.0 when contacted with a layer of the fluorinated photopolymer having been exposed to patterned radiation.

In an embodiment, the occurrence of unwanted delamination of the fluorinated photopolymer is reduced. In an embodiment, good contrast can be achieved within a reasonable development time window, thereby improving system robustness. In an embodiment, using a mixture of first and second solvents in the developing solution can improve development performance. In an embodiment, using a stripping solution that includes at least the first or second solvent of the developing solution can simplify recycling of such solvents thereby lowering manufacturing cost.

BRIEF DESCRIPTION OF DRAWINGS

FIG. 3A-3F is a series of cross-sectional views depicting various stages in the formation of a patterned active organic material structure according to an embodiment of the present invention; and FIG. 4A-4D is a series of cross-sectional views depicting various stages in the formation of a patterned active organic material structure according to another embodiment of the present invention.

DETAILED DESCRIPTION

Figure 1:
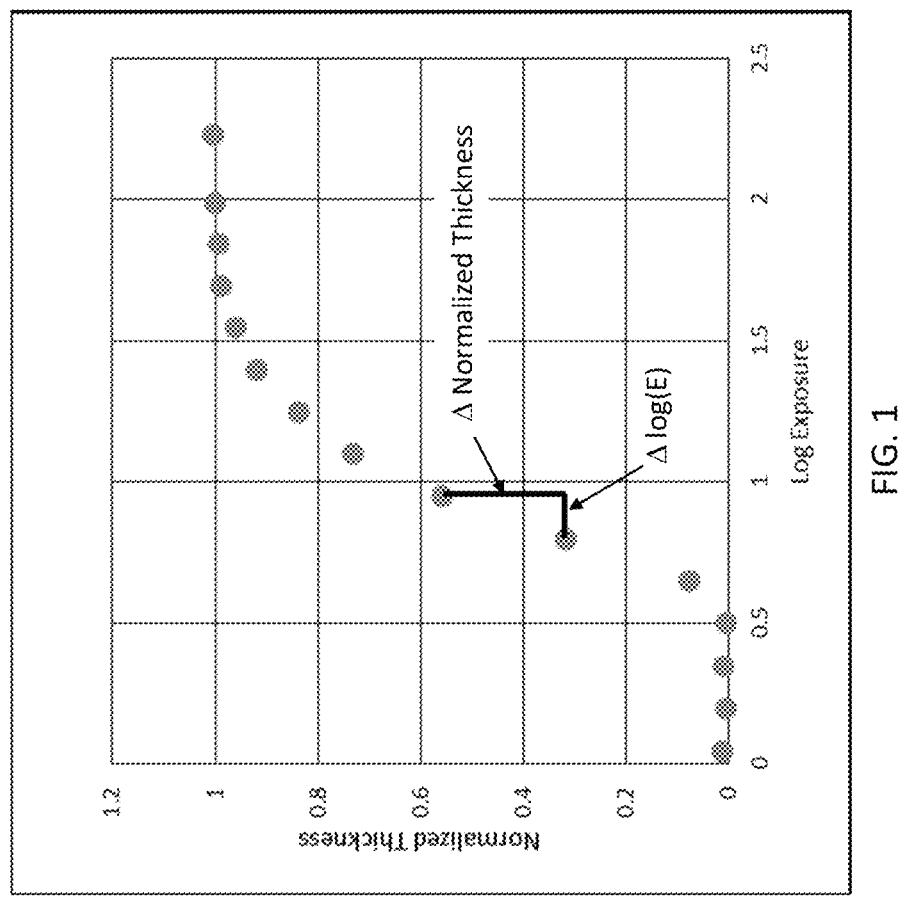
FIG. 1 is a representative plot of normalized thickness vs. log (exposure) used to determine photopolymer contrast.

It is to be understood that the attached drawings are for purposes of illustrating the concepts of the invention and may not be to scale.

A photopolymer composition of the present disclosure includes a light-sensitive fluorinated photopolymer that can be coated to produce a photo-patternable film. The present fluorinated photopolymers can be used to pattern devices, e.g., multilayer electronic devices, optical devices, medical devices, biological devices and the like. In an embodiment, the fluorinated photopolymer is used as a photoresist and removed (stripped) after use. Alternatively, the fluorinated photopolymer may remain in a device structure to provide another function, e.g., as a barrier layer or a dielectric material.

An embodiment of the present invention is directed to an improved method of developing images in certain fluorinated photopolymers using a fluorinated solvent, or a mixture of fluorinated solvents, selected to provide a maximum contrast in a particular range. The solvents for the fluorinated photopolymer composition, the developing solution and optional stripping solution are each chosen to have low interaction with other device material layers that are not intended to be dissolved or otherwise damaged. Such solvents are collectively termed "orthogonal" solvents. This can be tested by, for example, immersion of a device comprising the material layer of interest into the solvent prior to operation. The solvent is orthogonal if there is no serious reduction in the functioning of the device.

Certain embodiments disclosed in the present disclosure are particularly suited to the patterning of solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials, medical materials and biological materials. Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are preferentially coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix.

Depending on the particular material set and solvation needs of the process, the fluorinated solvent may be selected from a broad range of materials such as chlorofluorocarbons (CFCs), hydrochlorofluorocarbons (HCFCs), hydrofluorocarbons (HFCs), perfluorocarbons (FCs), hydrofluoroethers (HFEs), perfluoroethers, perfluoroamines, trifluoromethyl-substituted aromatic solvents, fluoroketones and the like.

Particularly useful fluorinated solvents include those that are perfluorinated or highly fluorinated liquids at room temperature, which are immiscible with water and many (but not necessarily all) organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1,1,1,2,3,4,4,5,5,6,6,6-dodecafluoro-2-trifluoromethyl-hexane (HFE-7500 aka Novec™ 7500), 1,1,1,2,3,3-hexafluoro-4-(1,1,2,3,3,3,-hexafluoropropoxy)-pentane (HFE 7600 aka Novec™ 7600), 1-methoxy-heptafluoropropane (HFE-7000), 1,1,1,2,2,3,4,5,5,5-decafluoro-3-methoxy-4-trifluoromethylpentane (HFE-7300 aka Novec™ 7300), 1,3-(1,1,2,2-tetrafluoroethoxy)benzene (HFE-978m), 1,2-(1,1,2,2-tetrafluoroethoxy)ethane (HFE- 578E), 1,1,2,2-tetrafluoroethyl-1H,1H,5H-octafluoropentyl ether (HFE-6512), 1,1,2,2-tetrafluoroethyl-2,2,2-trifluoroethyl ether (HFE-347E), 1,1,2,2-tetrafluoroethyl-2,2,3,3-tetrafluoropropyl ether (HFE-458E), and 1,1,1,2,2,3,3,4,4,5,5,6,6-tridecafluorooctane-propyl ether (TE6O-C3).

In some embodiments, minor amounts of a non-fluorinated solvent may be added to the developing solution or optional stripping solution. Such non-fluorinated solvents include chlorinated solvents, alcohols and other protic organic solvents, and substituted or unsubstituted hydrocarbons and aromatic hydrocarbons, so long as they are miscible with the fluorinated solvent in the amounts desired for the developing and optional stripping solutions and maintain orthogonal behavior with respect to active organic materials.

The fluorinated photopolymer of the present disclosure is one that has a total fluorine content of at least 15% by weight relative to the photopolymer. In an embodiment, the fluorinated photopolymer comprises at least three distinct repeating units, including a first repeating unit having a fluorine-containing group, a second repeating unit having an acid- or alcohol-forming precursor group, and a third repeating unit different from the first and second repeating units, wherein the photopolymer has a total fluorine content in a weight range of 15 to 60% relative to the total photopolymer weight. In an embodiment, the total fluorine content is in a weight range of 25 to 60%, or alternatively in a weight range of 30 to 60%, or alternatively in a weight range of 35 to 50% relative to the total photopolymer weight. The terms "photopolymer", "polymer" and "copolymer" include oligomers in addition to higher MW polymers. In an embodiment, the MW of the photopolymer is at least 2500 daltons, or in another embodiment at least 5000 daltons, or in another embodiment, at least 10,000 daltons. A copolymer is suitably a random copolymer, but other copolymer types can be used, e.g., block copolymers, alternating copolymers, graft copolymers and periodic copolymers. The term "repeating unit" is used broadly herein and simply means that there is at least one unit, typically more than one unit, on a polymer chain. The term is not intended to convey that there is necessarily any particular order or structure with respect to the other repeating units unless specified otherwise. When a repeating unit represents a low mol % of the combined repeating units, there may be only one unit on a polymer chain. The fluorinated photopolymer may be a chemically amplified material. A coatable fluorinated photopolymer solution may include a fluorinated photopolymer material and a coating solvent, and may optionally further include one or more additional components such as a photoacid generator, a stabilizer, a light sensitizer, a light filter, an acid scavenger (quencher) or a coating aid. Common quenchers include, but are not limited to, basic nitrogen-containing compounds such as tertiary amines. A layer comprising the fluorinated photopolymer material should be sensitive to radiation, e.g., UV or visible light, e-beam, X-ray and the like, so that the solubility properties of the exposed areas are selectively altered to enable development of an image. In a preferred embodiment, the radiation is UV or visible light.

Examples of fluorinated photopolymers include, but are not limited to, materials disclosed in application nos. U.S. Ser. No. 12/994,353, PCT/US2011/034145, and PCT/US2012/034748, along with U.S. provisional patent application Nos. 61/829,523, 61/829,536, 61/829,551, 61/829,556, 61/857,890 and 61/903,450, the entire contents of which are incorporated by reference.

The photopolymer may optionally be blended with one or more other polymers, preferably other fluorine-containing polymers. The total fluorine content of the blended polymers may suitably be in a weight range of 15 to 60% relative to the total weight of the blended polymers. The photopolymer may be produced, for example, by co-polymerizing suitable monomers containing the desired repeating units along with a polymerizable group. The polymerizable group may, for example, be polymerized by step-growth polymerization using appropriate functional groups or by a chain polymerization such as radical polymerization. Some non-limiting examples of useful radical polymerizable groups include acrylates (e.g. acrylate, methacrylate, cyanoacrylate and the like), acrylamides, vinylenes (e.g., styrenes), vinyl ethers and vinyl acetates. Alternatively, the photopolymer be produced by functionalizing preformed polymers to attach desired repeating units.

In an embodiment, the fluorine containing group of the first repeating unit is a fluorine-containing alkyl or aryl group that may optionally be further substituted with chemical moieties other than fluorine, e.g., chlorine, a cyano group, or a substituted or unsubstituted alkyl, alkoxy, alkylthio, aryl, aryloxy, amino, alkanoate, benzoate, alkyl ester, aryl ester, alkanone, sulfonamide or monovalent heterocyclic group, or any other substituent that a skilled worker would readily contemplate that would not adversely affect the performance of the fluorinated photopolymer. In a preferred embodiment, the fluorine-containing group is an alkyl group having at least 5 fluorine atoms, or alternatively, at least 10 fluorine atoms. In an embodiment, the alkyl group is a hydrofluorocarbon or hydrofluoroether having at least as many fluorine atoms as carbon atoms. In an embodiment, the fluorine-containing group is perfluorinated alkyl or a 1H,1H,2H,2H-perfluorinated alkyl having at least 4 carbon atoms, for example, 1H,1H,2H,2H-perfluorooctyl (i.e., 2-perfluorohexyl ethyl). Throughout this disclosure, unless otherwise specified, any use of the term alkyl includes straight-chain, branched and cyclo alkyls. In an embodiment, the first repeating unit does not contain protic or charged substituents, such as hydroxy, carboxylic acid, sulfonic acid, quaternized amine or the like. A non-limiting example of a polymerizable monomer having a fluorine containing group is 1H,1H,2H,2H-perfluorooctyl methacrylate ("FOMA").

In an embodiment, the second repeating unit is an acid-forming precursor group. Upon exposure to light, the acid-forming precursor group generates a polymer-bound acid group, e.g., a carboxylic or sulfonic acid. This can drastically change its solubility relative to the unexposed regions thereby allowing development of an image with the appropriate solvent. In an embodiment, the developing solution includes a fluorinated solvent that selectively dissolves unexposed areas.

One class of acid-forming precursor groups includes the non-chemically amplified type (i.e., non-acid catalyzed). An example of a second monomer with such a group is 2-nitrobenzyl methacrylate. The non-chemically amplified precursor group may directly absorb light to initiate de-protection of the acid-forming groups. Alternatively, a sensitizing dye may be added to the composition whereby the sensitizing dye absorbs light and forms an excited state capable of directly sensitizing or otherwise initiating the de-protection of acid-forming precursor groups. The sensitizing dye may be added as a small molecule or it may be attached or otherwise incorporated as part of the copolymer. Unlike chemically amplified formulations that rely on generation of an acid (see below), non-chemically amplified photopolymers may sometimes be preferred when a photopolymer is used in contact with an acid-sensitive or acid-containing material. Some active organic materials can be sensitive to the presence of an acid or contain some acid.

A second class of acid-forming precursor groups includes the chemically amplified type. This typically requires addition of a photo-acid generator (PAG) to the photopolymer composition, e.g., as a small molecule additive to the solution. The PAG may function by directly absorbing radiation (e.g. UV light) to cause decomposition of the PAG and release an acid. Alternatively, a sensitizing dye may be added to the composition whereby the sensitizing dye absorbs radiation and forms an excited state capable of reacting with a PAG to generate an acid. The sensitizing dye may be added as a small molecule, e.g., as disclosed in U.S. provisional application No. 61/857,890, which is incorporated herein by reference. The sensitizing dye may instead be attached to, or otherwise incorporated as part of, the copolymer as a third repeating unit, as discussed below. In an embodiment, the sensitizing dye (either small molecule or attached) is fluorinated. In an embodiment, the sensitizing dye may be provided in a range of 0.5 to 10% by weight relative to the total copolymer weight. The photo chemically generated acid catalyzes the de-protection of acid-labile protecting groups of the acid-forming precursor. In certain cases, such de-protection may occur at room temperature, but commonly, an exposed chemically amplified photopolymer is heated for a short time ("post exposure bake") to more fully activate de-protection "switching". In some embodiments, chemically amplified photopolymers can be particularly desirable since they enable the exposing step to be performed through the application of relatively low energy UV light exposure (e.g., less than 500 mJ/cm$^2$ or in some embodiments under 100 mJ/cm$^2$). This is advantageous since some active organic materials useful in applications to which the present disclosure pertains may decompose in the presence of too much UV light, and therefore, reduction of the energy during this step permits the photopolymer to be exposed without causing significant photolytic damage to underlying active organic layers. Also, reduced light exposure times improve the manufacturing throughput of the desired devices.

Examples of acid-forming precursor groups that yield a carboxylic acid include, but are not limited to: A) esters capable of forming, or rearranging to, a tertiary cation, e.g., t-butyl ester, 2-methyl-2-adamantyl ester, 1-ethylcyclopentyl ester, 1-ethylcyclohexyl ester, and isobornyl ester; B) esters of lactone, e.g., γ-butyrolactone-3-yl, γ-butyrolactone-2-yl, mavalonic lactone, 3-methyl-γ-butyrolactone-3-yl, 3-tetrahydrofuranyl, and 3-oxocyclohexyl; C) acetal esters, e.g., 2-tetrahydropyranyl, 2-tetrahydrofuranyl, and 2,3-propylenecarbonate-1-yl; D) beta-cyclic ketone esters, E) alpha-cyclic ether esters and F) MEEMA (methoxy ethoxy ethyl methacrylate) and other esters which are easily hydrolyzable because of anchimeric assistance. In an embodiment, the second monomer comprises an acrylate-based polymerizable group and a tertiary alkyl ester acid-forming precursor group, e.g., t-butyl methacrylate ("TBMA") or 1-ethylcyclopentyl methacrylate ("ECPMA").

In an embodiment, the solubility-altering reactive group is an hydroxyl-forming precursor group (also referred to herein as an "alcohol-forming precursor group"). The hydroxyl-forming precursor includes an acid-labile protecting group and the photopolymer composition typically includes a PAG compound and operates as a "chemically amplified" type of system. Upon exposure to light, the PAG generates an acid (either directly or via a sensitizing dye as described above), which in turn, catalyzes the de-protection of the hydroxyl-forming precursor group, thereby forming a polymer-bound alcohol (hydroxyl group). This significantly changes its solubility relative to the unexposed regions thereby allowing development of an image with the appropriate fluorinated solvent. In an embodiment, the developing solution includes a fluorinated solvent that selectively dissolves unexposed areas.

In an embodiment, the hydroxyl-forming precursor has a structure according to formula (1):

wherein $R_5$ is a carbon atom that forms part of the second repeating unit (or second polymerizable monomer), and $R_{10}$ is an acid-labile protecting group. Non-limiting examples of useful acid-labile protecting groups include those of formula (AL-1), acetal groups of the formula (AL-2), tertiary alkyl groups of the formula (AL-3) and silane groups of the formula (AL-4).

In formula (AL-1), $R_{11}$ is a monovalent hydrocarbon group, typically a straight, branched or cyclic alkyl group, of 1 to 20 carbon atoms that may optionally be substituted with groups that a skilled worker would readily contemplate would not adversely affect the performance of the precursor. In an embodiment, $R_{11}$ may be a tertiary alkyl group. Some representative examples of formula (AL-1) include:

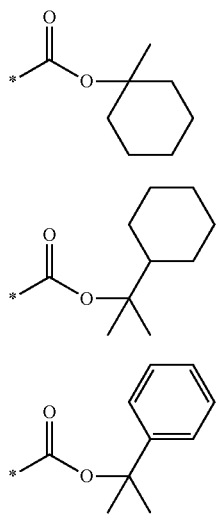

AL-1-3

AL-1-4

AL-1-5

In formula (AL-2), $R_{14}$ is a monovalent hydrocarbon group, typically a straight, branched or cyclic alkyl group, of 1 to 20 carbon atoms that may optionally be substituted. $R_{12}$ and $R_{13}$ are independently selected hydrogen or a monovalent hydrocarbon group, typically a straight, branched or cyclic alkyl group, of 1 to 20 carbon atoms that may optionally be substituted. Some representative examples of formula (AL-2) include:

AL-2-1

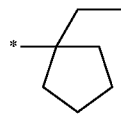

AL-2-2

AL-2-3

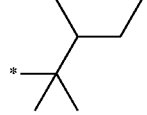

AL-2-4

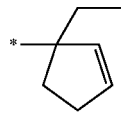

AL-2-5

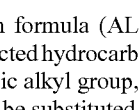

AL-2-6

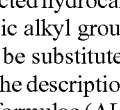

AL-2-7

In formula (AL-3), $R_{15}$, $R_{16}$, and $R_{17}$ represent an independently selected a monovalent hydrocarbon group, typically a straight, branched or cyclic alkyl group, of 1 to 20 carbon atoms that may optionally be substituted. Some representative examples of formula (AL-3) include:

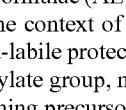

AL-3-1

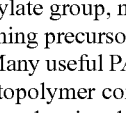

AL-3-2

AL-3-3

AL-3-4

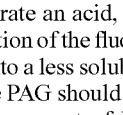

AL-3-5

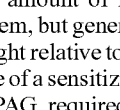

AL-3-6

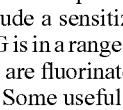

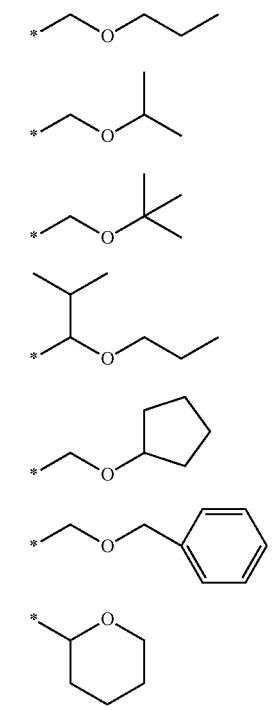

In formula (AL-4), $R_{18}$, $R_{19}$ and $R_{20}$ are independently selected hydrocarbon groups, typically a straight, branched or cyclic alkyl group, of 1 to 20 carbon atoms that may optionally be substituted.

The descriptions of the above acid-labile protecting groups for formulae (AL-2), (AL-3) and (AL-4) have been described in the context of hydroxyl-forming precursors. These same acid-labile protecting groups, when attached instead to a carboxylate group, may also be used to make some of the acid-forming precursor groups described earlier.

Many useful PAG compounds exist that may be added to a photopolymer composition. In the presence of proper exposure and optional sensitization, this photo-acid generator will liberate an acid, which will react with the second monomer portion of the fluorinated photopolymer material to transform it into a less soluble form with respect to fluorinated solvents. The PAG should have some solubility in the coating solvent. The amount of PAG required depends upon the particular system, but generally, will be in a range of about 0.1 to 6% by weight relative to the copolymer. In an embodiment, the presence of a sensitizing dye may substantially reduce the amount of PAG required relative to a composition that does not include a sensitizing dye. In an embodiment, the amount of PAG is in a range of 0.1 to 3% relative to the copolymer. PAGS that are fluorinated or non-ionic or both are particularly useful. Some useful examples of PAG compounds include 2-[2,2,3,3,4,4,5,5-octafluoro-1-(nonafluorobutylsulfonyloxy-imino)-pentyl]-fluorene (ONPF) and 2-[2,2,3,3,4,4,4-heptafluoro-1-(nonafluorobutylsulfonyloxyimino)-butyl]-fluorene (HNBF). Other non-ionic PAGS include: norbornene-based non-ionic PAGs such as N-hydroxy-5-nor-bornene-2,3-dicarboximide perfluorooctanesulfonate, N-hydroxy-5-norbornene-2,3-dicarboximide perfluorobutanesulfonate, and N-hydroxy-5-norbornene-2,3-dicarboximide trifluoromethanesulfonate; and naphthalene-based non-ionic PAGs such as N-hydroxynaphthalimide perfluorooctanesulfonate, N-hydroxynaphthalimide perfluorobutanesulfonate and N-hydroxynaphthalimide trifluoromethanesulfonate.

Some additional classes of PAGs include: triarylsulfonium perfluoroalkanesulfonates, such as triphenylsulfonium perfluorooctanesulfonate, triphenylsulfonium perfluorobutanesulfonate and triphenylsulfonium trifluoromethanesulfonate; triarylsulfonium hexafluorophosphates (or hexafluoroantimonates), such as triphenylsulfonium hexafluorophosphate and triphenylsulfonium hexafluoroantimonate; triaryliodonium perfluoroalkanesulfonates, such as diphenyliodonium perfluorooctanesulfonate, diphenyliodonium perfluorobutanesulfonate, diphenyliodonium trifluoromethanesulfonate, di-(4-tert-butyl)phenyliodonium perfluorooctanesulfonate, di-(4-tert-butyl)phenyliodonium perfluorobutanesulfonate, and di-(4-tert-butyl)phenyliodonium trifluoromethanesulfonate; and triaryliodonium hexafluorophosphates (or hexafluoroantimonates) such as diphenyliodonium hexafluorophosphate, diphenyliodonium hexafluoroantimonate, di-(4-tert-butyl)phenyliodonium hexafluorophosphate, and di-(4-tert-butyl)phenyliodonium hexafluoroantimonate. Suitable PAGs are not limited to those specifically mentioned above. Combinations of two or more PAGs may be used as well.

In an embodiment, the third repeating unit comprises a sensitizing dye. The presence of a sensitizing dye can reduce the amount of radiation exposure required for imaging the photopolymer. Many "small molecule" sensitizing dyes have solubility limitations in fluorinated solvents. The fluorinated polymer can help solubilize an attached sensitizing dye, thereby enabling the use of a sensitizing dye that might otherwise have poor solubility. Some non-limiting examples of sensitizing dyes that may be attached to the fluorinated photopolymer include those disclosed in U.S. provisional patent application Nos. 61/829,523, 61/829,536, 61/829,551, and 61/829,556, which are incorporated herein by reference.

In an embodiment, a third repeating unit comprising a sensitizing dye has no fluorine atoms and is provided in a weight range of 1 to 10% relative to the copolymer, alternatively in a weight range of 1 to 6% relative to the copolymer, or in another embodiment, in a weight range of 1 to 4% relative to the copolymer.

In an embodiment, the third repeating unit comprising a sensitizing dye is also partially fluorinated. The fluorine atoms can be included as part of a polymerizable group or as part of the sensitizing dye. Fluorine can be attached to an alkyl, aryl or heteroaryl moiety. In an embodiment, the third repeating unit has three or more fluorine atoms attached to an alkyl group. In an embodiment, a fluorinated third repeating unit is provided in a weight range of 1 to 20% relative to the copolymer, alternatively in a weight range of 5 to 15% relative to the copolymer.

In an embodiment, the third repeating unit comprising a sensitizing dye has a light absorption peak in a range of 330 to 450 nm (as measured in a deposited film or in a fluorinated solvent solution). Although other wavelengths can be used, this range is compatible with many of the photolithographic, mercury lamp exposure units available in the industry that use i-line, h-line or g-line exposures. Many of the fluorinated photoresist systems of the prior art are designed for shorter wavelength radiation and have poor efficiency in this wavelength range. In an embodiment, the sensitizing dye enables sensitization of more than just i-line, h-line or g-line alone. For example, the sensitizing dye may have a light absorption peak in a range of 405 to 436 nm, and preferably, the light absorption at 405 nm is in a range of 0.33 to 3 times, preferably 0.5 to 2 times, the light absorption at 436 nm. Such a system has good sensitivity to both h-line and g-line radiation.

Some non-limiting examples of useful sensitizing dye classes include cyanine dyes, rhodamine compounds, dialkylaminobenezes, diaryl ketones (e.g., benzophenones), arylalkyl ketones (e.g., acetophenones), chromanones, xanthones, thioxanthones, benzothiazoles, benzoxazoles, benzimidazoles, pyrimidines, quinolines, coumarins, psoralens, pyrromethenes, naphthalenes, anthracenes, tetracenes, pyrelenes, and pyrenes.

In an embodiment, the third repeating unit comprises a "dry-etch-resistant" group. It is common in photolithography to etch patterns into layers using a "dry etchant" with the patterned photopolymer acting as an etch barrier. Herein, the term "dry etchant" is used broadly and refers to any useful gaseous material possessing energy sufficient to etch (remove) a target material. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations.

It can be advantageous, therefore, for the photopolymer to have reasonable resistance to the dry etch to ensure good pattern transfer to the underlying layer. The fluorinated photopolymer may optionally comprise a repeating unit having a dry-etch-resistant group that includes at least one dry-etch-resistant atom having an atomic weight of at least 24. In an embodiment, the dry-etch-resistant atom is Si, Ti, Ge, Al, Zr, or Sn. The dry-etch-resistant group may optionally be formed from a polymerizable monomer, e.g., one that has an organosilane, a siloxane, silazane or metalloxane group. In a preferred embodiment, the dry-etch-resistant group includes a silane or siloxane group. In an embodiment, the mole ratio of the third repeating unit comprising a dry-etch-resistant group relative to the combined first and second repeating units is in a range of 0.1 to 1.

In an embodiment, the third repeating unit may comprise a branching unit to form a branched polymer, e.g., as disclosed in U.S. provisional patent application No. 61/903,450, which is incorporated by reference, herein. The term "branched polymer" refers to a polymer chain having at least one branching unit that forms one or more branch points connecting three or more chain segments. In some embodiments, branched fluorinated photopolymers have improved solubility. This makes available more variations in repeating units that may otherwise have impractically low solubility in straight-chain type polymers. A branched copolymer of the present disclosure may be a brush/comb type, a star type, a hyperbranched type, dendrimer type or any other known in the art. The branched copolymer may simply have three chain segments or many more. A generic structure is shown below as branched polymer (A):

(A)

wherein Ch1 is a first chain segment, Ch2 is a second chain segment, Ch3 is a third chain segment and BU is a branching unit. In an embodiment, the branching unit may be conveniently defined as a single atom capable of bonding to at least three polymer chain segments, e.g., a carbon, nitrogen, silicon or aluminum atom. In an embodiment, the branching unit may be conveniently defined as chemical compound, typically a compound having multiple polymerizable groups or other functional groups capable of forming branch points.

In an embodiment, the branching unit is provided by a branching monomer having at least two polymerizable sites capable of being copolymerized with the first monomer and second monomer. Some representative examples of branching monomers include: aliphatic or alicyclic divinyl hydrocarbons such as isoprene, butadiene, 3-methyl-1,2-butadiene, 2,3-dimethyl-1,3-butadiene, 1,2-polybutadiene, pentadiene, hexadiene, octadiene, cyclopentadiene, cyclohexadiene, cyclooctadiene, norbornadiene, and the like; aromatic divinyl hydrocarbons such as divinylbenzene, divinyltoluene, divinylxylene, trivinylbenzene, divinylbiphenyl, divinylnaphthalene, divinylfluorene, divinylcarbazole, divinylpyridine, and the like; diivinyl and diallyl esters such as divinyl adipate, divinyl maleate, divinyl phthalate, divinyl isophthalate, divinyl itaconate, vinyl(meth)acrylate, diallyl maleate, diallyl phthalate, diallyl isophthalate, diallyl adipate, allyl(meth)acrylate, and the like; divinyl and diallyl ethers such as diallyl ether, diallyloxyethane, triallyloxyethane, tetraallyloxyethane, tetraallyloxypropane, tetraallyloxybutane, tetramethallyloxyethan; divinyl ether, diethylene glycol divinyl ether, triethylene glycol divinyl ether, and the like; divinyl ketones; diallyl ketones; fluorine-containing divinyl compounds such as 1,4-divinylperfluorobutane, 1,6-divinylperfluorohexane, 1,8-divinylperfluorooctane, and the like; nitrogen-containing divinyl compounds such as diallylamine, diallylisocyanurate, diallylcyanurate, methylenebis(meth)acrylamide, bismaleimide, and the like; silicon-containing divinyl compound such as dimethyldivinylsilane, divinylmethylphenylsilane, diphenyldivinylsilane, 1,3-divinyl-1,1,3, 3-tetramethyldisilazane, 1,3-divinyl-1,1,3,3-tetraphenyldisilazane, diethoxyvinylsilane, and the like.

In a preferred embodiment, the branching monomer having at least two polymerizable sites are based on (meth)acrylic acid esters such as ethylene glycol di(meth)acrylate (EGD(M)A), triethylene glycol di(meth)acrylate, propylene glycol di(meth)acrylate, neopentyl glycol di(meth)acrylate, trimethylolpropane tri(meth)acrylate, ditrimethylolpropane tetra (meth)acrylate, glycerol tri(meth)acrylate, pentaerythritol tetra(meth)acrylate, alkoxytitanium tri(meth)acrylate, 1,6-hexanediol di(meth)acrylate, 2-methyl-1,8-octanediol di(meth)acrylate, 1,9-nonanediol di(meth)acrylate, 1,10-decanediol di(meth)acrylate, tricyclodecanedimethanol di(meth)acrylate, dioxane glycol di(meth)acrylate, 2-hydroxy-1-acryloyloxy-3-methacryloyloxypropane, 2-hydroxy-1,3-di(meth)acryloyloxypropane, 9,9-bis[4-(2-(meth)acryloyloxyethoxy)phenyl]fluorene, undecylenoxy ethyleneglycol di(meth)acrylate, bis[4-(meth)acryloylthiophenyl]sulfide, bis[2-(meth)acryloylthioethyl]sulfide, 1,3-adamantanediol di(meth)acrylate, 1,3-adamantanedimethanol di(meth)acrylate, and the like.

A combination of multiple branching monomers or branching units having different chemical structures may be used. In an embodiment, the mole % of branching units relative to the total of all copolymer units is in a range of 1-10%, or alternatively, in a range of 2-6%. Methods for preparing branched polymers by radical polymerization can be found, for example, in U.S. Pat. No. 6,646,068 and US Publication No. 2012/0135206, the contents of which are incorporated by reference. In an embodiment, chain transfer agents are used in conjunction with a radical polymerization initiator to control branching.

Non-limiting examples of useful chain transfer agents include thiols such as alkyl mercaptans (e.g., dodecyl mercaptan), alkylk thioglycolates (e.g., 2-ethyl hexyl thioglycolate), polyfunctional thiols, and brominated compounds such as carbon tetrabromide. In the polymerization reaction, a thiol type chain transfer agent may terminate polymerization of a chain segment by addition of a thiol radical to form a sulfur-containing terminal group, e.g., a thioether. In the case of carbon tetrabromide, a chain segment-terminating bromine or a bromine-containing group may be formed. In an embodiment, chain transfer agent is provided into the reaction vessel in a mol ratio relative to the branching monomer in a range of 0.05 to 10, or in another embodiment in a range of 0.1 to 5, or in another embodiment 0.5 to 2.

In an embodiment, the third repeating unit comprises an acid- or alcohol-forming precursor group different from the second repeating unit.

More than three different repeating units may be used in the present fluorinated photopolymer. These additional repeating units may comprise, e.g., an acid-forming precursor, an alcohol-forming precursor, a sensitizing dye, a dry-etch-resistant group or a branching unit, or combinations thereof. Other useful groups may be incorporated into the third repeating unit or additional repeating unit besides the ones listed above.

The fluorinated photopolymer composition may optionally include additives such as stabilizers, coating aids, light absorbers, acid scavengers ("quenchers") and the like.

The fluorinated photopolymer composition of the present disclosure may be applied to a substrate (sometimes referred to herein as a device substrate) using any method suitable for depositing a photosensitive liquid material. For example, the composition may be applied by spin coating, curtain coating, bead coating, bar coating, spray coating, dip coating, gravure coating, ink jet, flexography or the like. The composition may be applied to form a uniform film or a patterned layer of unexposed photopolymer. Alternatively, the photopolymer can be applied to the substrate by transferring a preformed fluorinated photopolymer layer (optionally patterned) from a carrier sheet, for example, by lamination transfer using heat, pressure or both. In such an embodiment, the substrate or the preformed photopolymer layer may optionally have coated thereon an adhesion promoting layer.

In an embodiment, the first repeating unit of the photopolymer is largely responsible for the general solubility of the copolymer in fluorinated solvents whereas the acid- or alcohol-forming precursor groups act as the solubility "switch" as previously described. In certain embodiments, with sufficient fluorine content, the photopolymer can be made both hydrophobic and oleophobic. That is, the resulting material repels or resists both water and many organic solvents, permitting these materials to serve as an in-process encapsulation layers to protect the underlying organic materials from moisture and damage from organic solvents.

The contrast of the present fluorinated photopolymer system is an important factor that depends both upon the photopolymer and upon the developing solution. In an embodiment, the developing solution comprises at least a first fluorinated solvent, preferably a hydrofluoroether. Higher contrast is typically preferred, as it generally results in straighter sidewalls for imaged areas and overall better discrimination between imaging light and stray light for improved feature resolution. For good imaged line shapes, it is desirable that the maximum contrast be at least 1.5, preferably at least 1.9 and more preferably at least 2.1. However, unlike conventional photoresists, it has been unexpectedly found that photopolymer/developer systems of the present disclosure having maximum contrasts higher than about 5 are prone to yield film delamination, especially in regions of moderate exposure. Delamination often results in portions of not-fully-solubilized exposed photopolymer re-depositing in unintended areas. In some cases, significant "debris" is formed over the substrate. This is undesirable as it can result in serious device defects. One can try and address this by increasing exposure, but this sometimes results in unwanted line broadening due to light scatter or flare. In particular, image patterns having a variety of feature dimensions and densities become more prone to delamination because small, sparse features may receive significantly less exposure than large/dense feature areas. Surprisingly, by selecting the developing solution to provide a maximum contrast to a range of about 1.9 to about 5.0, preferably 2.1 to 4.3, the occurrences of delamination can be reduced and the system becomes more robust to variations in exposure across the image. It is particularly desirable if the maximum photopolymer contrast is in the range of about 1.9 to about 5.0 for at least a 15 sec time window within a development contact time period of 15 to 150 seconds. The larger this time window is, the more robust the developer/photopolymer system is to variations in the development process. Although shorter or longer development contact time periods can be used in certain embodiments, a contact time period shorter than 15 seconds may be difficult to control whereas a longer contact time period may result in slower throughput and increased takt time. In an embodiment, the dissolution rate of the unexposed photopolymer in the developing solution is in a range of 10 to 100 nm/sec.

To study contrast, the following method was generally used. It may be modified as needed in order to select a developing solution that provides a maximum contrast in a range of 1.9 to 5.0. A subject fluorinated photopolymer was spin coated onto a silicon wafer and soft-baked on a hot plate for 1 min at 90° C. The film thickness was generally in a range of about 1 to 1.5 um. An optical 22 step tablet (~0.15 density units per step) was laid on top of the wafer and the resist was exposed to 365 nm radiation using a 16 W black light lamp. The maximum exposure dose was typically about 175 mJ/cm². The wafer was post-exposure baked (PEB) on a hot plate for 1 min at 90° C. to activate the switching reaction. The film thickness was then immediately measured in 24 areas (steps). In addition to the 22 areas of the step tablet, the maximum exposure dose was measured just outside of the step tablet area (point 1) as well as a minimum exposure dose area (covered by a metal disc) that received no exposure (point 24).

Five minutes after the PEB, the wafer was contacted with ~10 mL of a developer solution by forming a "puddle" over the wafer and spin-dried after the target time was reached. The time of each puddle and number of puddles depended on the system. After each puddle, the film thicknesses were measured in the same 24 areas. Film thicknesses after each puddle were normalized to the starting thickness and plotted versus log Exposure (log(E)) to create a set of contrast curves. The contrast between each point was calculated using equation 1:

$$\text{Contrast} = [-\Delta \text{ normalized thickness}]/[-\Delta \log(E)] \quad \text{(Eq. 1)}$$

The highest calculated contrast (the "maximum contrast") for each curve was determined. FIG. 1 shows an example graph of normalized thickness vs. log(E)—for clarity, only the first 16 points are shown. Other parameters can also be determined as desired such as "0.5 speed point" (exposure dose at normalized density=0.5), "Emax erosion" (normalized thickness loss of the maximum exposure point 1), "time to clear" (time it takes for the minimum exposure to be fully removed), and "time to strip" (time it takes for maximum exposure to be fully removed).

The developing solution comprises at least a first fluorinated solvent, preferably a hydrofluoroether. In an embodiment, the first fluorinated solvent is the only fluorinated solvent in the developing solution. This can be advantaged because it is a simple solution to prepare and control in a manufacturing environment.

In an alternative embodiment, the developing solution comprises a mixture of first and second fluorinated solvents. In a particularly useful embodiment, at least one of the solvents is a hydrofluoroether. In a preferred embodiment, both solvents are hydrofluoroethers. It should be noted that, although either or both of the first and second solvents can each be an isomeric mixture (e.g., HFE-7100, HFE-7200 or any fluorinated solvent comprising multiple stereoisomers), the first and second solvents are not isomeric to each other. If an isomeric mixture is used as the first or second solvent, the isomeric components preferably have the same or similar boiling points, i.e., within a range of 10° C. and more preferably within a range of 5° C. (as measured at atmospheric pressure).

It has been found that in certain embodiments, development time can be reduced and contrast adjusted into the range of 1.9 to 5.0 more quickly by using a mixture of first and second fluorinated solvents, particularly first and second hydrofluoroethers. Another advantage is that using a mixture of commercially available fluorinated solvents eliminates the need to design and tailor a special fluorinated solvent to match a particular fluorinated photopolymer or vice versa in order to achieve the desired contrast range in a target development time. As discussed later, mixtures of solvents can also have advantages with respect to solvent recycling when an additional stripping step is used. A few non-limiting embodiments of developing solutions comprising first and second fluorinated solvents are discussed below.

Mixed Solvent Developer

General Embodiment 1

In this embodiment, the first solvent is one that has a high degree of discrimination between solubilizing exposed and unexposed regions of the photopolymer layer. Typically, the first solvent dissolves the unexposed regions at a moderate rate, but dissolves the exposed (switched) region at a much lower rate, preferably at least 10× lower. This helps produce an image with reasonable contrast and tolerable processing latitude, but an image may take longer than desired to develop appropriately. The second solvent is one that dissolves the unexposed regions at a rate greater than the first solvent rate, and preferably, also dissolves the exposed regions a rate higher than the first solvent rate. That is, the second solvent is generally a stronger solvent than the first solvent for both exposed and unexposed areas. Both should be selected to have a low interaction with sensitive, active organic materials if present during processing. Preferably the first and second solvents are both hydrofluoroethers. In this embodiment, the majority of the volume of the developing solution is typically from the first solvent, but it has been unexpectedly found that a small or moderate amount of the second solvent can significantly increase development rate and improve cleanout of small features without detrimental stripping action. Takt time is reduced and the development of small features is improved. In an embodiment, the developing solution includes the first solvent in a volume range of 75 to 99% and the second solvent in a volume range of 1 to 25%. Alternatively, the developing solution comprises the first solvent in a volume range of 90 to 98% and the second solvent in a volume range of 2 to 10%. The volumes of first and second solvents do not necessarily have to add up to 100%, as small amounts of additional materials may be present in the developing solution. In an embodiment, the first and second solvents comprise at least 97% of the total volume of developing solution. In another embodiment, the first and second solvents comprise at least 99% of the total volume of developing solution. The ratio of solvents can be adjusted to suit the preferred development time, which might depend upon the available processing equipment. The ratio of solvents can also be adjusted to suit the particular fluorinated photopolymer system. Although not limiting, useful development times are in a range from 15 sec to 150 sec, or alternatively, 30 sec to 120 sec. Longer times can impact throughput and shorter times can be difficult to control.

In the present "Mixed Solvent Developer—General Embodiment 1", an optional stripping solution typically includes at least the second solvent. Optionally, it may further include the first solvent. In the case of the stripping solution having both first and second solvents, it has been surprisingly found that that the second solvent does not always have to be present in the majority, but it is usually at least 30% by volume and may be in a volume range of 30 to 99%. The first solvent can be in a range from 1 to 70%. In an embodiment, the stripping solution includes the second solvent in a volume range of 40 to 97% and first solvent is in a range from 3 to 60%. The volumes of first and second solvents do not necessarily have to add up to 100%, as small amounts of additional materials may be present in the stripping solution. In an embodiment, the first and second solvents comprise at least 90%, alternatively at least 97%, of the total volume of the stripping solution, which may optionally further include up to 10% of a water-soluble, polar or protic solvent such as an alcohol, e.g., IPA. If used, the amount of the protic solvent is preferably in a volume range of 0.001 to 3%. Lower amounts of protic solvents are generally more compatible with a wider array of active organic materials. The ratio of solvents can be adjusted to suit the preferred stripping time, which might depend upon the available processing equipment. The ratio of solvents can also be adjusted to suit the particular fluorinated photopolymer system.

Mixed Solvent Developer

General Embodiment 2

Here, the first solvent is one that has a high degree of discrimination between solubilizing exposed and unexposed regions of photopolymer layer. Typically, the first solvent dissolves the unexposed regions at a moderate rate, but dissolves the exposed (switched) region at a much lower rate, preferably at least 10× lower. This helps produce an image having reasonable contrast and with tolerable processing latitude, but an image may sometimes take longer than desired to develop appropriately. The second solvent in this embodiment is one that has higher solubilizing power than the first solvent with respect to removing the unexposed regions, but generally lacks sufficient solubilizing power to dissolve the exposed photopolymer alone. For example, the first solvent, although it shows some development and good discrimination, may be too slow to be practical on its own. Conversely, the second solvent may be too fast to control, and although it is not capable of stripping the exposed portion, it may lead to some film delamination due to its high strength, making a neat solution of the second solvent unsuitable as either a developing or stripping solution.

It has been found that an appropriate mixture of the first and second solvents can provide rapid development with good contrast. The ratio of first and second solvents in this embodiment depends upon the system, but each solvent is typically be in a volume range of 5 to 95%. In this embodiment, the optional stripping solution typically comprises a protic solvent. In an embodiment, the optional stripping solution includes at least the first or second solvent and up to about 20% by volume of a protic solvent (e.g. an alcohol such as IPA), preferably in a range, 0.05 to 10%. Lower amounts of protic solvents are generally more compatible with a wider array of active organic materials. The stripping solution may optionally have the same ratio of first and second solvents as used in the developing solution, but the overall concentrations are different due to the presence of the protic solvent. Preferably, the stripping solution will have a higher ratio of second solvent to first solvent than the developing solution.

Mixed Solvent Developer

General Embodiment 3

Here, the first solvent generally provides low solubilizing strength with respect to both the exposed and unexposed regions of the photopolymer. The second solvent is one that can solubilize both exposed and unexposed portions, but has a higher dissolution rate for the unexposed portions. When sufficient second solvent is added to the first solvent, the developing solution is capable of selectively solubilizing unexposed regions, i.e., dissolving unexposed regions at a rate that is at least 10 times higher than solubilization of the exposed areas. In this embodiment, the volume percentage of the second solvent is in a range from 20 to 80%, preferably 25 to 60%. The optional stripping solution will include the second solvent, optionally with a small amount of the first solvent or protic solvent or both. The volume of the second solvent in the stripping solution in this embodiment is at least 80%, preferably at least 90%.

When using mixed solvents for the developing solution and at least one common solvent in the stripping solution, inexpensive recycling methods can advantageously be used to recover and reuse the solvents. This reduces both the manufacturing cost and environmental impact. If the photopolymer coating solution is part of the same waste stream to be recycled, it is preferred that it also uses either the first or second solvent or a combination thereof. This further simplifies recycling.

In an embodiment, the first and second solvents are fluorinated solvents, at least one of which is a hydrofluoroether, and the waste stream from at least the developing and stripping steps are collected and reused using a recycling apparatus. The collected mixture of fluorinated solvents can be reconstituted, e.g., by adding fresh solvent, to provide the correct mixture ratio for use in either the developing or stripping solution. Preferably, prior to reuse, the recycling apparatus separates the solvent mixture from suspended and dissolved solids, e.g., by a flash evaporation step under reduced pressure using a simple roto-evaporating apparatus. Alternatively or in addition to flash evaporation, filtration can be used. Preferably, prior to reuse, the recycling apparatus washes the solvent mixture to remove water soluble components such as protic solvents. Washing and filtering methods disclosed in US 2010/0126934 (the contents of which is incorporated by reference) can optionally be used.

In a further embodiment, the boiling points of the first and second solvents differ by at least 25° C. (measured at atmospheric pressure) and a recycling apparatus is used to achieve at least partial separation of the first and second solvents by distillation. Prior to distillation, suspended and dissolved solids can optionally be removed and the solvent mixture can optionally be washed, as discussed above. When solvent mixtures are used for at least the developing solution and optionally the stripping solution, high purity solvent reclamation is not required and a simple distillation column may be used to achieve reasonable levels of solvent separation. Alternatively, a fractional distillation column may be used, but an expensive system should not be required because high purity (>99%) is not necessary in mixed solvent developer embodiments. The simple, low-cost recycling apparatus permits on-site recycling and eliminates possible issues regarding shipping wastes from manufacturing sites. The ability to use the mixed waste stream can eliminate the need for multiple solvent recycling stations to handle developing and stripping solutions separately.

At least two fractions are typically recovered by distillation. One recycled solvent mixture is rich in the first solvent and the other recycled solvent mixture is rich in the second solvent. Depending on the needs of the developing and stripping solutions, these may be used directly, or they can be mixed with an appropriate amount of pure solvent to produce the desired ratio. In an embodiment, a recycled solvent mixture is used directly as the stripping solution without the addition of a pure solvent.

Another use for the recycled solvent mixtures is in edge bead removal. Edge bead removal (EBR) is a process whereby a coating of photopolymer is removed from an edge area of a substrate where the thickness of the photopolymer is usually larger than desired and where no imaging is needed. This can be done, for example, by directing focused jet or spray of edge bead removal solvent. In embodiments wherein the first and second solvents are used and both have reasonable solubilizing power for unexposed photopolymer, the recycled mixture should provide an inexpensive EBR solvent for photopolymers.

Although not limited, the present invention can be used to form devices having a layer of sensitive, active organic material (see above). Such devices may include electronic devices such as TFTs, touch screens, OLED lighting and displays, e-readers, LCD displays, solar cells, sensors and bioelectronics devices. These devices are typically multilayer structures having numerous other layers such as dielectric layers, optical layers, conductors and a support. Devices may include non-electronic devices such as optical, medical, and biological devices having some patterned active organic material, but that do not require an electrical conductor or semiconductor to operate (e.g., lenses, color filter arrays, down- or up-conversion filters, medical/biological test strips and the like). The device substrate onto which the fluorinated photopolymer is provided may include a single layer of a support material or may include a multilayer structure having a support and numerous additional layers. The substrate surface is not necessarily planar. The substrate and support are optionally flexible. Support materials include, but are not limited to, plastics, metals, glasses, ceramics, composites and fabrics.

Figure 2:
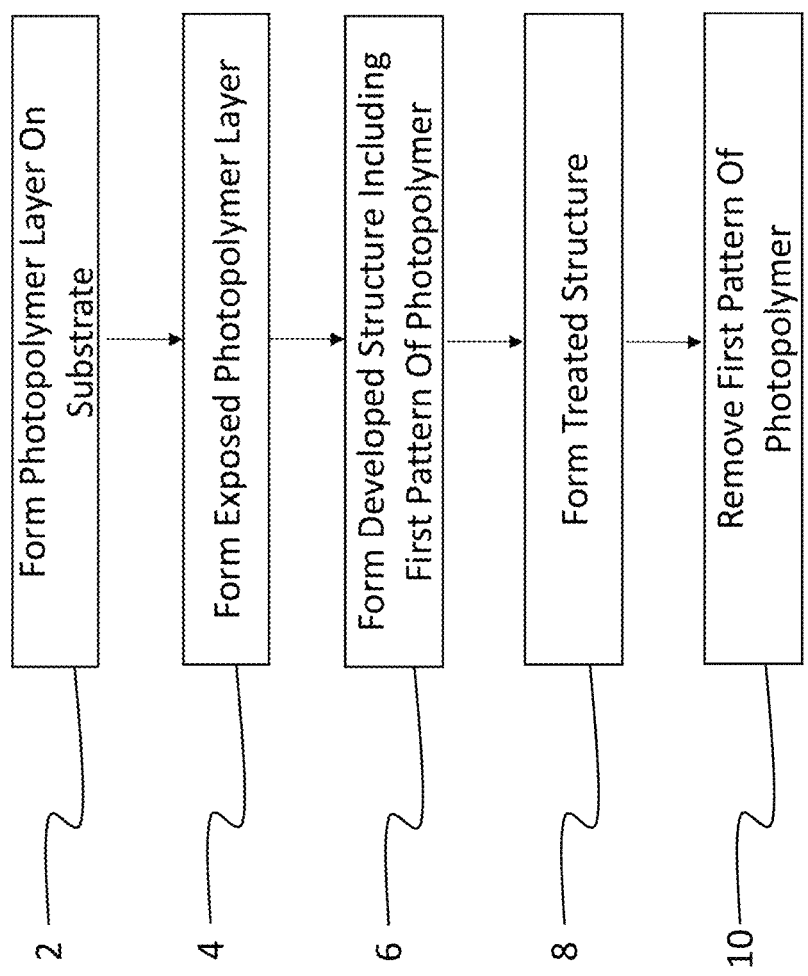
FIG. 2 is a flow chart depicting the steps in an embodiment of the present invention.

A flow diagram for an embodiment of the present invention is shown in FIG. 2, and includes the step 2 of forming a photopolymer layer on a substrate. This can be accomplished using methods previously described.

In step 4, the photopolymer layer is exposed to patterned radiation, e.g. UV light, to form an exposed photopolymer layer having a pattern of exposed photopolymer and a complementary pattern of unexposed photopolymer. The term "radiation" refers to any radiation to which the photopolymer is sensitive and can form areas of differential developability due to some chemical or physical change caused by the radiation exposure. Non-limiting examples of radiation include UV, visible and IR light, e-beams and X-rays. Commonly, the radiation is from UV or visible light. Patterned radiation can be produced by many methods, for example, by directing exposing light through a photomask and onto the photopolymer layer. Photomasks are widely used in photolithography and often include a patterned layer of chrome that blocks light. The photomask may be in direct contact or in proximity. When using a proximity exposure, it is preferred that the light has a high degree of collimation. Alternatively, the patterned light can be produced by a projection exposure device. In addition, the patterned light can be from a laser source that is selectively directed to certain portions of the photopolymer layer. After exposure and optional post exposure bake, at least some of the acid- or alcohol-forming precursor groups in the exposed pattern have reacted to form an acid or alcohol group.

In step 6, a developed structure is formed that includes a first pattern of photopolymer. This can be done by contacting the exposed photoresist layer to a developing solution selected to provide a maximum photopolymer contrast in a range of 1.9 to 5.0. During development, the complementary pattern of unexposed photopolymer is removed (negative working photopolymer). Development leaves behind a developed structure having a first pattern of photopolymer that covers the substrate and a complementary second pattern of uncovered substrate corresponding to the removed portion of photopolymer. By uncovered substrate, it is meant that the surface of the substrate is substantially exposed or revealed to a degree that it can be subjected to further treatments—a small amount of residual photopolymer may be present in some embodiments. Contacting the exposed photopolymer layer can be accomplished by immersion into the developing solution or by applying the developing solution in some way, e.g., by spin coating or spray coating. The contacting can be performed multiple times if necessary.

In step 8, a treated structure is formed by treating the developed structure in some way. In an embodiment, the treating includes a chemical or physical etch of the second pattern of uncovered substrate. In this case, the first pattern of photopolymer acts as an etch barrier. In another embodiment, the treating includes chemically modifying the surface of the second pattern of uncovered substrate or the first pattern of photopolymer. In another embodiment, the treating includes doping the second pattern of uncovered substrate, e.g., to modify its conductivity. In yet another embodiment, the treating includes coating the developed structure with, for example, an active organic material that is deposited both on the surface of the first pattern of photopolymer and on the second pattern of uncovered substrate. In any of the above embodiments, the substrate may optionally include an active organic material layer such that the uncovered substrate is the surface of that active organic material layer.

In step 10, the first pattern of photopolymer is optionally removed from the treated structure using a stripping solution. In embodiments wherein the surface of the first pattern of photopolymer is covered with another layer of material, e.g., an active organic material layer, that portion is also removed. This is sometimes referred to as a "lift off" process.

Turning now to FIG. 3, there is a series of cross-sectional views depicting the formation of a patterned active organic material structure at various stages according to an embodiment of the present invention. In FIG. 3A, a substrate 20 includes a layer of active organic material 24 provided on a support 22. In FIG. 3B, a fluorinated photopolymer layer 26 is formed on the substrate 20 and in contact with the layer of active organic material 24. Next, as shown in FIG. 3C, photopolymer layer 26 is exposed to patterned light by providing a photomask 30 between the photopolymer layer 26 and a source of collimated light 28. The exposed photopolymer layer 32 includes a pattern of exposed photopolymer areas 34 and complementary pattern of unexposed photopolymer areas 36. The structure is then developed in a developing solution selected to provide a maximum photopolymer contrast in a range of 1.9 to 5.0. As illustrated in FIG. 3D the unexposed areas 36 of the photopolymer are selectively dissolved to form a developed structure 38 having a first pattern of photopolymer 40 covering the substrate, and a complementary second pattern of uncovered substrate 42, in this case the layer of active organic material 24, corresponding to the removed portion of photopolymer. Turning now to FIG. 3E, a treated structure 44 is formed by subjecting the developed structure 38 to a chemical or physical etch that selectively removes active organic material from the second pattern of uncovered substrate, thereby forming a patterned layer of active organic material 46 corresponding to the first pattern. By corresponding, it is meant that the patterned layer of active organic material 46 substantially resembles that of the first pattern of photopolymer 40, but the two patterns are not necessarily identical. For example, the etching might also etch the sidewalls of the patterned layer of active organic material, thereby making the dimensions slightly smaller than the first pattern. Conversely, etching kinetics or diffusion might be such that the dimensions of the patterned layer of active organic material are slightly larger than the first pattern. Further, the patterned layer of active organic material might not have vertical sidewalls as shown. Rather than rectangular, its cross section could resemble a trapezoid, an inverted trapezoid (undercut), or some other shape, e.g., one having curved sidewalls. Referring to FIG. 3F, treated structure 44 is contacted with a stripping solution that removes the first pattern of photopolymer 40, thereby forming patterned active organic material structure 48 having the (now bare) patterned layer of active organic material 46. Patterned active organic material structure 48 may optionally be subjected to additional steps, if necessary, to form a functional device such as an organic TFT array, an OLED display, an e-reader, a solar cell, a bioelectronic device or the like.

FIG. 4 shows a series of cross-sectional views depicting the formation of a patterned active organic material structure at various stages according to another embodiment of the present invention. In FIG. 4A, a fluorinated photopolymer layer 126 is formed on substrate 120. This structure is then exposed and developed as described above to form developed structure 138, as shown in FIG. 4B. Developed structure 138 has a first pattern of photopolymer 140 covering the substrate, and a complementary second pattern of uncovered substrate 142 corresponding to a removed portion of photopolymer. Turning now to FIG. 4C, a treated structure 144 is formed by depositing a layer of active organic material 145 over both the first pattern of photopolymer and the second pattern of uncovered substrate. In FIG. 4D, the treated structure 144 is then contacted with a stripping solution that removes the first pattern of photopolymer and the active organic material deposited over the first pattern of photopolymer, thereby forming patterned active organic material structure 148 having a patterned layer of active organic material 146 corresponding to the second pattern. By corresponding, it is meant that the patterned layer of active organic material 146 substantially resembles that of the second pattern of uncovered substrate 142, but the two patterns are not necessarily identical. Patterned active organic material structure 148 may optionally be subjected to additional steps, if necessary, to form a functional device such as an organic TFT array, an OLED display, an e-reader, a solar cell, a bioelectronic device or the like.

EXAMPLES

In the examples below, most of the HFE solvents were purchased from 3M under their Novec™ brand. For convenience, the solvents are simply referred to by their HFE number. HFE-6512 was purchased from Top Fluorochem Co, LTD.

Synthesis Example 1

Methods of preparing fluorinated photopolymers of the present disclosure can be found in various references cited above. A representative example of preparing a fluorinated photopolymer is described below and can be modified to accommodate different amounts or types of polymerizable monomers.

A copolymer solution was formed from the polymerization of: FOMA as a first monomer, TBMA as a second monomer and AMMA (9-anthrylmethyl methacrylate) as a third monomer. The relative ratios of the three monomers were 49.9/48.0/2.1 mol %, respectively, and the polymerization was carried out in a hydrofluoroether solvent. The total fluorine content of the copolymer was 42.5% by weight (relative to the total copolymer weight). Synthesis Example 1 further included 0.8 wt % PAG (relative to the copolymer weight), added to the solution. The following procedure was used.

A clean, dry 1 L four-neck jacketed reactor was equipped with a Teflon-blade mechanical stirrer, a reflux condenser having a mineral oil bubbler, a nitrogen inlet (the height of which could be adjusted to be below the surface of the reaction solution), and a programmable constant temperature bath (CTB) attached to the reactor jacket. To the reactor was charged FOMA (177.2 g, 0.410 mol), AMMA (4.7 g, 0.017 mol, from Osakashinyaku Co., Ltd) TBMA (56.0 g, 0.394 mol), AIBN (4.65 g, 0.028 mol) and HFE-7600 solvent (460.9 g). The nitrogen inlet was placed below the surface of the solution, and with good stirring, the reaction solution was sparged with nitrogen for 1 h. During the nitrogen sparge, the CTB was pre-warmed to 78° C. with the flow to the reactor jacket turned off. When the sparge was complete, the gas inlet tube was raised above the solution level and the nitrogen flow was reduced to maintain a slow flow through the system during the reaction. The valves between the pre-heated CTB and the reactor were opened and the reaction solution was stirred with heating for 18 h. The CTB was set to 21° C., and when the polymer solution was cooled, a total of 1283.7 g of HFE-7600 was added to the polymer solution to rinse it out of the reactor and to achieve a suitable viscosity for coating operations. A sample of the polymer solution could be removed at that point and either stripped of solvent or precipitated in cold methanol to provide a sample for analytical testing. Under yellow lights, PAG CGI 1907 ("ONPF") from BASF (1.9032 g, 2.683 mmol) was added. The PAG slowly dissolved in the photopolymer solution over approximately 30 minutes. The light-sensitive solution was filtered repeatedly using nitrogen pressure through a 0.05 micrometer cartridge filter to provide a solution for coating.

Example 1

A fluorinated photopolymer solution was spin coated onto the silicon wafer and then soft-baked at 90° C. for 60 seconds.

The photopolymer layer was about 1.4 μm thick. The photopolymer solution included a HFE-7600 as coating solvent, CGI 1907 as PAG (0.8% wt relative to polymer wt), and a photopolymer material comprising copolymer of FOMA, TBMA and AMMA (9-anthrylmethyl methacrylate) as sensitizing dye, the polymer having 42.5% by weight of fluorine relative to the polymer. Contrast curves were measured using a step tablet process as described above using HFE-7300 (b.p.=98° C.) as the developer and a maximum exposure dose energy of about 175 mJ/cm². The process was then repeated for various mixtures of HFE-7300 and HFE-6512 (b.p.=133° C.), and various parameters were determined as reported in Table 1. Note that maximum contrast values were only reported if the low exposure regions had fully been removed and when Emax erosion was less than 0.25. Larger erosion levels often make the photopolymer system impractical. In Table 1, at HFE-6512 concentrations of 25% or higher, the "time to clear" is reported as "<30" sec. In these cases, 90 to 95% of the polymer in the low exposure region was actually removed in the first 15 sec puddle. For reasons not fully understood, it is often observed that the first puddle, almost independent of puddle time, leaves a small residue of 0.05 to 0.10 of normalized thickness. If shorter puddle times were used, the time to clear would likely be much less than 30 sec. Also, in some cases, the "time to strip" entries are estimates based on simple extrapolations from the available data.

TABLE 1

| Solvent Ratio HFE7300/ HFE6512 | Time to Clear (sec) | Max Contrast (time, sec) | Emax Erosion (time, sec) | Time to Strip (sec) | Delamination (time, sec) |
|---|---|---|---|---|---|
| 100/0 | 150 | 1.6 (150) | n/a | n/a | Not observed |
| 95/5 | 60 | 2.1 (60) | | n/a | Not observed |
| | | 2.0 (90) | 0.02 (90) | | |
| 90/10 | 30 | 2.4 (30) | | n/a | Not observed |
| | | 2.4 (60) | | | |
| | | 1.8 (90) | 0.07 (90) | | |
| 75/25 | <30 | 1.7 (30) | 0.16 (30) | 180 (est.) | Not observed |
| | | | 0.30 (60) | | |
| | | | 0.43 (90) | | |
| 50/50 | <30 | n/a | 0.36 (30) | 60 | Not observed |
| 25/75 | <30 | n/a | 0.95 (30) | 35 (est.) | Not observed |
| 10/90 | <30 | n/a | 0.95 (30) | 35 (est.) | Not observed |
| 0/100 | <30 | n/a | 0.94 (30) | 35 (est.) | Not observed |

In Table 1, it is noted that the development rate of this photopolymer in pure HFE-7300 is very slow. The first "puddle" that was clear in the low exposure area was the puddle corresponding to 150 sec total development time. The contrast was only 1.6 at this time. Perhaps higher contrast could eventually be achieved by extending the development time, but such extended development time can be prohibitive from a practical manufacturing standpoint. However, when 5 or 10% HFE-6512 is added, much better contrasts are achieved in a shorter amount of time without any delamination. Further, there is a good development time window for achieving these contrasts. At 25% HFE-6512, the Emax is starting to show significant erosion and the mixture has essentially become an effective, albeit slightly slow, stripping solution. By 50% HFE-6512, the stripping rate is much faster. There contrast curves for 75% HFE-6512 and 90% HFE-6512 were not significantly different from 100% HFE-6512, showing that there is a broad range of mixtures that are effective for stripping if so desired.

Example 2

The same fluorinated photopolymer solution used in Example 1 was spin coated onto the silicon wafer and then soft-baked at 90° C. for 60 seconds. The photopolymer layer was about 1.4 μm thick. Contrast curves were measured as described above using HFE-7500 (b.p.=128° C.) as the developer. The process was then repeated for various mixtures with HFE-7200 (b.p.=76° C.). Various parameters were determined and reported in Table 2.

TABLE 2

| Solvent Ratio HFE7500/ HFE7200 | Time to Clear (sec) | Max Contrast (time, sec) | Emax Erosion (time, sec) | Time to Strip (sec) | Delamination (time, sec) |
|---|---|---|---|---|---|
| 100/0 | 150 | 1.2 (150) | n/a | n/a | Not observed |
| 90/10 | 90 | 1.4 (90) | n/a | n/a | Not observed |
| | | 2.4 (150) | | | |
| 80/20 | 60 | 1.8 (60) | n/a | n/a | Not observed |
| | | 2.1 (90) | | | |
| | | 2.6 (150) | | | |
| 20/80 | 15 | 2.2 (15) | | n/a | Not observed |
| | | 3.3 (30) | 0.03 (30) | | |
| 0/100 | 15 | 2.2 (15) | | n/a | |
| | | 2.0 (30) | | | |
| | | 5.8 (60) | 0.03 (60) | | Yes (60) |
| 0/100 + 0.5% vol. IPA | 15 | n/a | 0.64 (15) | 30 | Not observed |
| 20/80 + 0.5% vol. IPA | 15 | n/a | 0.30 (15) | 60 | Not observed |
| 0/100 + 0.1% vol. IPA | 15 | 1.7 (15) | 0.08 (15) | 60 | Not observed |
| | | 3.7 (30) | 0.10 (30) | | |

Referring to Table 2, it is observed that pure HFE-7500 is similar to HFE-7300 in that it takes 150 sec to clear and the contrast is low. Adding 10 or 20% of HFE-7200 to the developing solution significantly reduces time to clear and improves contrast. Going as far as 80% HFE-7200 produces a very short clear time and slightly better contrasts. HFE-7200 is a much stronger developing solvent than HFE-7500, and when used at 100% it produces a clear time of 15 sec and good contrasts at 2.2 (15 sec) and 2.0 (sec), but by 60 sec, step #4 (~51 mJ/cm²) has delaminated based on the debris pattern. Not shown in the table, by 90 sec, additional steps have delaminated. Thus, the pure solvent is not as robust as some of the mixtures. It is also noted that HFE-7200 alone is not an effective stripping agent in this system. This example falls into the category of "Mixed Solvent Developer—General Embodiment 2", and adding just 0.5% by volume of isopropyl alcohol (IPA) makes it a very effective stripping solution. Similarly, 0.5% IPA by volume added to the 20/80 HFE-7500/HFE-7200 blend is also highly effective. Interestingly, adding only 0.1% by volume of IPA to pure HFE-7200 can be made to produce a developing solution having good contrast without delamination, but the development time window is very short. By 30 sec, the only film left was in point 1 (Emax)—all the others had developed away. Shortly thereafter, this step is also removed. Thus, the 0.1% IPA solution is also an effective stripping solution. It appears that there may be an induction period for stripping of Emax, but once it starts, it strips very rapidly. Such as system is not expected to be robust as a developing solution. Not shown, but a pure HFE-7500 with 0.5% IPA is not an effective stripping solution. Thus, it is preferred that the majority of the stripping solution volume comes from the higher activity solvent.

Example 3

A fluorinated photopolymer was spin coated onto the silicon wafer and then soft-baked at 90° C. for 60 seconds. The photopolymer layer was about 1.4 μm thick. The photopolymer solution included a HFE-6512 as coating solvent, CGI 1907 as PAG (0.8% by wt relative to polymer wt), and a branched polymer comprising a copolymer of FOMA, TBMA, ECPMA, EGDMA (ethylene glycol dimethylacrylate) and AMMA in mole ratios of 27.3, 30.4, 37.3, 3, and 2, respectively. The photopolymer had 28% by weight of fluorine relative to the polymer weight. Contrast curves were measured as described above using HFE-7200 as the developer. The process was then repeated for various mixtures of HFE-7200 and HFE-7600, and various parameters were determined as reported in Table 3. Note that maximum contrast values were only reported if the low exposures had fully been removed and when Emax erosion was less than 0.25. In Table 7, the pure HFE-7600 "time to clear" entry is "<30" sec. In fact, 95% of the polymer in the low exposure region was actually in the first 15 sec puddle. For reasons not fully understood, it is often observed that the first puddle, almost independent of puddle time, leaves a small residue of 0.05 to 0.10 of normalized thickness. If shorter puddle times were used, the time to clear would likely be much less than 30 sec. Interestingly, adding just 10% HFE-7200 eliminates this residual effect. Also, the "time to strip" entries are estimates based on extrapolations from the data.

TABLE 3

| Solvent Ratio HFE7200/ HFE7600 | Time to Clear (sec) | Max Contrast (time, sec) | Emax Erosion (time, sec) | Time to Strip (sec) | Delamination (time, sec - step #) |
|---|---|---|---|---|---|
| 100/0 | 30 | 1.2 (30) | 0.05 (30) | n/a | Not observed |
|  |  | 1.8 (60) | 0.09 (60) |  |  |
|  |  | 2.1 (90) | 0.10 (90) |  |  |
| 95/5 | 30 | 1.9 (30) | 0.09 (30) | n/a | Not observed |
|  |  | 2.1 (60) | 0.11 (60) |  |  |
|  |  | 2.5 (90) | 0.13 (90) |  |  |
| 90/10 | 15 | 1.3 (15) | 0.05 (15) | n/a | Not observed |
|  |  | 1.8 (30) | 0.13 (30) |  |  |
|  |  | 3.1 (60) | 0.17 (60) |  |  |
|  |  | 2.4 (90) | 0.20 (90) |  |  |
| 75/25 | 15 | 1.8 (15) | 0.10 (15) | n/a | Not observed |
|  |  | 1.8 (30) | 0.20 (30) |  |  |
|  |  |  | 0.27 (60) |  |  |
|  |  |  | 0.35 (90) |  |  |
| 10/90 | 15 | 2.0 (15) | 0.21 (15) | 105 (estimate) | Not observed |
|  |  |  | 0.27 (30) |  |  |
|  |  |  | 0.60 (60) |  |  |
|  |  |  | 0.85 (90) |  |  |
| 0/100 | <30 | n/a | 0.11 (15) | 110 (estimate) | Not observed |
|  |  |  | 0.34 (30) |  |  |
|  |  |  | 0.56 (60) |  |  |
|  |  |  | 0.82 (90) |  |  |

It is observed in Table 3 that adding 5 to 10% HFE-7600 to the developing solution can improve contrast and reduce time to clear, relative to pure HFE-7200, and without any delamination. Increasing HFE-7600 to 25% or higher results in increased Emax Erosion and the solution becomes a more effect stripping solution than a developing solution. Note that the 10/90 HFE-7200/HFE-7600 mixture is just as effective as the pure HFE-7600 in stripping, and may be slightly advantaged in that the mixture leaves less residual in the first 15 sec puddle.

Example 4

A fluorinated photopolymer was spin coated onto the silicon wafer and then soft-baked at 90° C. for 60 seconds. The photopolymer layer was about 1.4 μm thick. The photopolymer solution included a HFE-6512 as coating solvent, CGI 1907 as PAG (0.8% by wt relative to polymer wt), and a branched polymer comprising a copolymer of FOMA, TBMA, ECPMA, EGDMA and AMMA in mole ratios of 50, 11.5, 33.5, 3, and 2, respectively. The photopolymer had 40.5% by weight of fluorine relative to the polymer weight. Contrast curves were measured as described above using HFE-7300 as the developer and various parameters were determined as reported in Table 4. In this example, the maximum exposure dose was 108 mJ/cm$^2$. Mixed solvent developers were not tested.

TABLE 4

| Solvent | Time to Clear (sec) | Max Contrast (time, sec) | Emax Erosion (time, sec) | Time to Strip (sec) | Delamination (time, sec) |
|---|---|---|---|---|---|
| HFE-7300 | 30 | 2.4 (30) | n/a | n/a |  |
|  |  | 5.9 (60) |  |  | Yes (60) |
|  |  | 6.6 (90) |  |  | Yes (90) |

Table 4 shows that a good contrast is achieved in 30 sec using HFE-7300. Even higher contrast (above 5) is observed at 60 sec and 90 sec development time, but the photopolymer yielded delamination. For this developer, a contact time of about 30 sec or a little longer is acceptable, whereas 60 sec or more is not.

Example 5

A fluorinated photopolymer was spin coated onto the silicon wafer and then soft-baked at 90° C. for 60 seconds. The photopolymer layer was about 1.1 μm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 36.3, 36.3, 22.4, 3, and 2, respectively. The photopolymer had 33.6% by weight of fluorine relative to the polymer weight. Contrast curves were measured as described above using HFE-7200 as the developer and various parameters were determined as reported in Table 5. In this example, the maximum exposure dose was about 175 mJ/cm$^2$. Mixed solvent developers were not tested.

TABLE 5

| Solvent | Time to Clear (sec) | Max Contrast (time, sec) | Emax Erosion (time, sec) | Time to Strip (sec) | Delamination (time, sec) |
|---|---|---|---|---|---|
| HFE-7200 | 15 | 3.1 (15) |  | n/a |  |
|  |  | 2.0 (30) | 0.03 (30) |  |  |
|  |  | 4.4 (60) | 0.05 (60) |  | slight (60) |
|  |  | 5.7 (90) | 0.07 (90) |  | Yes (90) |

Table 5 shows that a good contrast is achieved in a developer contact time in a range of 15 sec to 60 sec using HFE-7200. Even higher contrast (above 5) is observed at 90 sec development time, but the photopolymer yielded unacceptable delamination. There was slight delamination at 60 sec, but the observed amount in this step tablet test is likely to be manageable in a manufacturing setting where the exposure range is more limited.

Example 6

A fluorinated photopolymer was spin coated onto the silicon wafer and then soft-baked at 90° C. for 60 seconds. The photopolymer layer was about 1.4 μm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 50, 26, 20, 2 and 2, respectively. The photopolymer had 41.3% by weight of fluorine relative to the polymer weight. Contrast curves were measured as described above using HFE-7200 as the developer and various parameters were determined as reported in Table 6. In this example, the maximum exposure dose was about 175 mJ/cm$^2$. Mixed solvent developers were not tested.

TABLE 6

| Solvent | Time to Clear (sec) | Max Contrast (time, sec) | Emax Erosion (time, sec) | Time to Strip (sec) | Delamination (time, sec) |
|---|---|---|---|---|---|
| HFE-7200 | 15 | 5.0 (15) | n/a | n/a | |
| | | 6.6 (30) | | | yes (60) |
| | | 6.4 (60) | | | Yes (90) |

Table 6 shows that a very good contrast is achieved in a developer contact time in just 15 sec without any delamination. Even higher contrasts (above 5) are observed at 30 and 60 sec development times, but the photopolymer yielded unacceptable delamination.

Example 7

A fluorinated photopolymer was spin coated onto the silicon wafer and then soft-baked at 90° C. for 60 seconds. The photopolymer layer was about 1.3 μm thick. The photopolymer solution included a HFE-6512 as coating solvent, CGI 1907 as PAG (0.8% by wt relative to polymer wt), and a branched polymer comprising copolymer of FOMA, TBMA, ECPMA, EGDMA and AMMA in mole ratios of 46, 16.5, 33.5, 3 and 2, respectively. The photopolymer had 38.2% by weight of fluorine relative to the polymer weight. Contrast curves were measured as described above using HFE-7300 as the developer and various parameters were determined as reported in Table 7. In this example, the maximum exposure dose was about 175 mJ/cm$^2$. Mixed solvent developers were not tested.

TABLE 7

| Solvent | Time to Clear (sec) | Max Contrast (time, sec) | Emax Erosion (time, sec) | Time to Strip (sec) | Delamination (time, sec) |
|---|---|---|---|---|---|
| HFE-7300 | 60 | 2.6 (60) | n/a | n/a | |
| | | 4.6 (90) | | | slight (90) |
| | | 5.7 (150) | | | Yes (150) |

Table 7 shows that a good contrast is achieved 60 sec using HFE-7300. At 90 sec, the contrast increases (4.6) with some slight delamination. At 150 sec the contrast is up to 5.7 and delamination has become more obvious.

Example 8

A fluorinated photopolymer was spin coated onto the silicon wafer and then soft-baked at 90° C. for 60 seconds. The photopolymer layer was about 1.5 μm thick. The photopolymer solution included a HFE-7600 as coating solvent, CGI 1907 as PAG (3.0% by wt relative to polymer wt), and a polymer comprising copolymer of FOMA, TBMA, and TMSOEMA (2-(trimethylsilyloxy)ethyl methacrylate) in mole ratios of 49.7, 30.2 and 20.1, respectively. The photopolymer had 41.1% by weight of fluorine relative to the polymer weight. Contrast curves were measured as described above using HFE-7300 as the developer and various parameters were determined as reported in Table 8. In this example, the maximum exposure dose was about 175 mJ/cm$^2$. Mixed solvent developers were not tested.

TABLE 8

| Solvent | Time to Clear (sec) | Max Contrast (time, sec) | Emax Erosion (time, sec) | Time to Strip (sec) | Delamination (time, sec) |
|---|---|---|---|---|---|
| HFE-7300 | 30 | 2.8 (30) | n/a | n/a | |
| | | 2.9 (60) | | | |
| | | 5.0 (90) | | | Very slight (90) |

Table 8 shows that a good contrast is achieved for 30, 60 and 90 sec using HFE-7300. At 90 sec, very slight delamination was observed, but the amount in this step tablet test is likely to be manageable in a manufacturing setting where the exposure range is more limited.

Example 9

A fluorinated photopolymer was spin coated onto the silicon wafer and then soft-baked at 90° C. for 60 seconds. The photopolymer layer was about 1.1 μm thick. The photopolymer solution included a HFE-7600 as coating solvent, CGI 1907 as PAG (2.0% by wt relative to polymer wt), and a polymer comprising copolymer of FOMA, TBMA, and AMMA in mole ratios of 23, 75 and 2, respectively. The photopolymer had 26.8% by weight of fluorine relative to the polymer weight. Contrast curves were measured as described above using HFE-7600 as the developer and various parameters were determined as reported in Table 9. In this example, the maximum exposure dose was about 172 mJ/cm$^2$. Mixed solvent developers were not tested.

TABLE 9

| Solvent | Time to Clear (sec) | Max Contrast (time, sec) | Emax Erosion (time, sec) | Time to Strip (sec) | Delamination (time, sec) |
|---|---|---|---|---|---|
| HFE-7600 | 30 | 2.9 (30) | n/a | n/a | Not observed |
| | | 3.6 (60) | | | |

Table 9 shows that a good contrast is achieved for 30 and 60 sec contact time with HFE-7600. No delamination was observed.

Example 10

A fluorinated photopolymer was spin coated onto the silicon wafer and then soft-baked at 90° C. for 180 seconds. The photopolymer layer was about 0.9 μm thick. The photopolymer solution included a HFE-7600 as coating solvent, CGI 1907 as PAG (2.0% by wt relative to polymer wt), and a polymer comprising copolymer of FOMA, ECPMA, and EGDMA in mole ratios of 20, 76 and 4, respectively. The photopolymer had 21.2% by weight of fluorine relative to the polymer weight. Contrast curves were measured as described above using HFE-7600 as the developer and various parameters were determined as reported in Table 9. In this example, the maximum exposure dose was about 325 mJ/cm$^2$. Mixed solvent developers were not tested.

TABLE 10

| Solvent | Time to Clear (sec) | Max Contrast (time, sec) | Emax Erosion (time, sec) | Time to Strip (sec) | Delamination (time, sec) |
|---|---|---|---|---|---|
| HFE-7600 | 30 | 3.3 (30) | n/a | n/a | Not observed |

Table 10 shows that a good contrast is achieved for 30 sec contact time with HFE-7600. No delamination was observed.

The invention has been described in detail with particular reference to certain preferred embodiments thereof, but it will be understood that variations, combinations, and modifications can be effected by a person of ordinary skill in the art within the spirit and scope of the invention.

LIST OF REFERENCE NUMBERS USED IN THE DRAWINGS 2 form photopolymer layer on substrate step
4 form exposed photopolymer layer step
6 form developed structure step
8 form treated structure step
10 remove first pattern of photopolymer step
20 substrate
22 support
24 layer of active organic material
26 photopolymer layer
28 light
30 photomask
32 exposed photopolymer layer
34 exposed photopolymer areas
36 unexposed photopolymer areas
38 developed structure
40 first pattern of photopolymer
42 second pattern of uncovered substrate
44 treated structure
46 patterned layer of active organic material
48 patterned active organic material structure
120 substrate
126 photopolymer layer
138 developed structure
140 first pattern of photopolymer
142 second pattern of uncovered substrate
144 treated structure
145 layer of active organic material
146 patterned layer of active organic material
148 patterned active organic material structure

The invention claimed is:

1. A method of patterning a device comprising:
providing a layer of a fluorinated photopolymer over a device substrate, the fluorinated photopolymer comprising at least three distinct repeating units, including a first repeating unit having a fluorine-containing group, a second repeating unit having an acid- or alcohol-forming precursor group, and a third repeating unit different from the first and second repeating units, wherein the photopolymer has a total fluorine content in a weight range of 15 to 60%;
exposing the photopolymer layer to patterned radiation to form an exposed photopolymer layer having a pattern of exposed photopolymer and a complementary pattern of unexposed photopolymer, wherein at least some of the acid- or alcohol-forming precursor groups in the exposed pattern react to form acid or alcohol groups; and
contacting the exposed photopolymer layer with a developing solution comprising at least a first hydrofluoroether that dissolves the unexposed photopolymer thereby forming a developed structure having a first pattern of photopolymer covering the substrate and a complementary second pattern of uncovered substrate, the developing solution selected to provide a maximum photopolymer contrast in a range of 1.9 to 5.0 for at least a 15 sec time window within a development contact time period of 15 to 150 seconds.

2. The method of claim 1 wherein the exposed photopolymer retains at least 75% of its thickness during the time window.

3. The method of claim 2 wherein the dissolution rate of the unexposed photopolymer is in a range of 10 to 100 nm/sec.

4. The method of claim 1 wherein the developing solution further comprises a second fluorinated solvent.

5. The method of claim 4 wherein the second fluorinated solvent is a second hydrofluoroether.

6. The method of claim 4 wherein the boiling points of the first and second fluorinated solvents differ by at least 25° C.

7. The method of claim 4 further comprising:
treating the developed structure to form a treated structure; and
contacting the treated structure with a stripping solution to remove the first pattern of photopolymer, the stripping solution comprising at least the first or second solvent in a concentration different from the developing solution.

8. The method of claim 7 wherein the stripping solution comprises both the first and second solvents in concentrations different from the developing solution.

9. The method of claim 7 wherein the stripping solution further comprises a protic solvent in a concentration range of 0.001% to 3% by volume.

10. The method of claim 7 wherein the stripping solution further comprises a protic solvent in a concentration range of 0.05% to 1% by volume.

11. The method of claim 1 wherein the third repeating unit comprises a sensitizing dye, a dry-etch-resistant group, a branching unit, an acid-forming precursor group, or an alcohol-forming precursor group.

12. The method of claim 11 wherein the fluorinated photopolymer further comprises one or more additional, independently selected repeating units.

13. The method of claim 12 wherein the one or more additional, independently selected repeating units comprise a sensitizing dye, a dry-etch-resistant group, a branching unit, an acid-forming precursor group, or an alcohol-forming precursor group.

14. The method of claim 1 wherein the layer of fluorinated photopolymer further includes a photo-acid generator compound.

15. A method of patterning a device comprising:
providing a layer of a fluorinated photopolymer over a device substrate, the fluorinated photopolymer comprising at least three distinct repeating units, including a first repeating unit having a fluorine-containing group, a second repeating unit having an acid- or alcohol-forming precursor group, and a third repeating unit different from the first and second repeating units, wherein the photopolymer has a total fluorine content in a weight range of 15 to 60%, the layer of fluorinated photopolymer further comprising a photo-acid generator compound and an acid quencher compound;
exposing the photopolymer layer to patterned radiation to form an exposed photopolymer layer having a pattern of exposed photopolymer and a complementary pattern of unexposed photopolymer, wherein at least some of the acid- or alcohol-forming precursor groups in the exposed pattern react to form acid or alcohol groups; and contacting the exposed photopolymer layer with a developing solution comprising at least a first fluorinated solvent that dissolves the unexposed photopolymer thereby forming a developed structure having a first pattern of photopolymer covering the substrate and a complementary second pattern of uncovered substrate, the developing solution selected to provide a maximum photopolymer contrast in a range of 1.9 to 5.0.

16. A negative photopolymer system, comprising:

a photosensitive composition comprising a fluorinated photopolymer provided in a hydrofluoroether coating solvent, wherein the fluorinated photopolymer comprises at least two distinct repeating units, including a first repeating unit having a fluorine-containing group, a second repeating unit having an acid- or alcohol-forming precursor group, and a third repeating unit different from the first and second repeating units wherein the copolymer has a total fluorine content in a weight range of 15 to 60%; and a developing solution comprising at least a first hydrofluoroether solvent, the developing solution selected to provide a maximum photopolymer contrast in a range of 1.9 to 5.0 for at least a 15 sec time window within a development contact time period of 15 to 150 seconds when contacted with a layer of the fluorinated photopolymer having been exposed to patterned radiation.

17. The system of claim 16 wherein the developing solution comprises a second hydrofluoroether solvent.

18. The system of claim 17 further comprising a stripping solution, the stripping solution including at least one of the first and second hydrofluoroether solvents in a concentration different from the developing solution.

* * * * *